US009363886B2

(12) United States Patent
Sakamoto et al.

(10) Patent No.: US 9,363,886 B2
(45) Date of Patent: Jun. 7, 2016

(54) ELECTRONIC SUBSTRATE AND AN ELECTRONIC APPARATUS

(75) Inventors: Hitoshi Sakamoto, Tokyo (JP); Minoru Yoshikawa, Tokyo (JP); Masaki Chiba, Tokyo (JP); Kenichi Inaba, Tokyo (JP); Arihiro Matsunaga, Tokyo (JP)

(73) Assignee: NEC Corporation, Tokyo (JP)

( * ) Notice: Subject to any disclaimer, the term of this patent is extended or adjusted under 35 U.S.C. 154(b) by 112 days.

(21) Appl. No.: 14/240,348

(22) PCT Filed: Aug. 15, 2012

(86) PCT No.: PCT/JP2012/071107
§ 371 (c)(1),
(2), (4) Date: Feb. 21, 2014

(87) PCT Pub. No.: WO2013/027737
PCT Pub. Date: Feb. 28, 2013

(65) Prior Publication Data
US 2014/0190738 A1    Jul. 10, 2014

(30) Foreign Application Priority Data
Aug. 25, 2011 (JP) .................................. 2011-183607

(51) Int. Cl.
*H05K 1/00* (2006.01)
*H05K 1/02* (2006.01)
(Continued)

(52) U.S. Cl.
CPC ............ *H05K 1/021* (2013.01); *F28D 15/0266* (2013.01); *G06F 1/20* (2013.01); *H05K 7/2029* (2013.01)

(58) Field of Classification Search
CPC ............ G06F 1/20; H05K 1/02; H05K 1/021; H05K 7/20; H05K 7/2029; H01L 23/427

USPC .............. 361/676–678, 679.46–679.54, 361/688–723, 831; 174/252, 548
See application file for complete search history.

(56) References Cited

U.S. PATENT DOCUMENTS 7,012,807 B2    3/2006  Chu et al.
2009/0262495 A1  10/2009  Neudorfer

FOREIGN PATENT DOCUMENTS

JP    10-209660    8/1998
JP    2001-156483  6/2001
(Continued)

OTHER PUBLICATIONS

Specification and drawings annexed to the request of Japanese Utility Model Application No. 109799/1990 (Laid-open No. 4-67399/1992), Jun. 15, 1992 (16 pgs.).
(Continued)

*Primary Examiner* — Courtney Smith
*Assistant Examiner* — Zhengfu Feng
(74) *Attorney, Agent, or Firm* — Wilmer Cutler Pickering Hale and Dorr LLP

(57) ABSTRACT

An electronic substrate has a tabular base material which can install a heater element and a cooling structure that cools the heater element. The electronic substrate can be plugged in/out in the direction which is almost parallel to the face of the base material. The cooling structure has a first heat radiation part with a hollow shape and a heat transfer part. The first heat radiation part radiates the generated heat of a heater element installed in the base material. A heat transfer part transfers the generated heat to the first heat radiation part. The first heat radiation part has a first joint surface formed along a face which is almost vertical to the insert and removal direction of the base material. The first heat radiation part is connected to a second radiation part set up in the case thermally through the first joint surface.

11 Claims, 15 Drawing Sheets

(51) Int. Cl.
*G06F 1/20* (2006.01)
*H05K 7/20* (2006.01)
*F28D 15/02* (2006.01)

(56) References Cited

FOREIGN PATENT DOCUMENTS

| | | |
|---|---|---|
| JP | 2001-230583 | 8/2001 |
| JP | 2009-271643 | 11/2009 |
| WO | WO-2011/040129 | 4/2011 |
| WO | WO 2011040129 A1 * | 4/2011 ............ H01L 23/427 |

OTHER PUBLICATIONS

International Search Report corresponding to International Application No. PCT/JP2012/071107, Sep. 18, 2012, 5 pages.

* cited by examiner

A-A

B-B

B-B

C-C

ARROW VIEW D

E-E

ARROW VIEW F

ELECTRONIC SUBSTRATE AND AN ELECTRONIC APPARATUS

CROSS-REFERENCE TO RELATED APPLICATIONS

This application is a national stage application of International Application No. PCT/JP2012/071107 entitled "Electronic Board and Electronic Device," filed on Aug. 15, 2012, which claims the benefit of the priority of Japanese Patent Application No. 2011-183607, filed on Aug. 25, 2011, the disclosures of each of which are hereby incorporated by reference in their entirety.

TECHNICAL FIELD

The present invention relates to an electronic substrate and an electronic apparatus, in particular, relates to a radiation technology for the generated heat of a heater element loaded on the surface of the electronic substrate.

BACKGROUND ART

In recent years, an electronic apparatus such as a communication apparatus and a PC carries out a great deal of operations at high speed rate at once, and has advanced rapidly in high performance and high functionality. A heater element of a central processing part (CPU) and an integrated circuit (Multi-chip Module: MCM) or the like tends to generate the heat very highly in particular among the parts implemented to an electronic apparatus such as ICT (Information and Communication Technology) apparatus.

In such electronic apparatus, the technology which radiates the generated heat of a heater element using a heat pipe is well known (the patent documents 1 and 2, for example).

In the patent document 1, the technology has been disclosed which radiates the generated heat of a heater element with the transfer of the generated heat of the heater element to a radiation part by joining the plate type heat pipe module including a plate type heat pipe and a heater element to a heat sink plate connected to the radiation part. Specifically, in technology described in the patent document 1, the plate type heat pipe and a heat sink plate are arranged oppositely so that they may be paralleled each other. One end of the plate type heat pipe is loaded on a detaching part installed in the heat sink plate. A taper-like taper block is installed in one end of the plate type heat pipe and a reverse taper-like face to the taper block is formed in the detaching part. And when the plate type heat pipe module is loaded on the heat sink plate, the edge side of the plate type heat pipe is pressed for the heat sink plate and the edge side and the heat sink plate of the plate type heat pipe are connected each other while the slopes formed by the plate type heat pipe and the taper in the detaching part are touching each other. As a result, the generated heat of the heater element is transferred to the radiation part through the edge side of the plate type heat pipe and the heat sink plate, and radiates.

In the patent document 2, the technology is enclosed which radiates the generated heat of a heater element with the transfer the generated heat of MCM to the backboard by installing a board (a substrate loading MCM) into which MCM has been loaded in the backboard. Specifically, a heat pipe which leads the generated heat of MCM is installed in the board in the technology described in the patent document 2. A backboard side heat pipe is installed in the backboard apart from this heat pipe. A heat transfer part is provided so as to project vertically to the board face. The backboard side heat pipe has a face which is parallel to the backboard. And when the board is inserted in the vertical direction to the backboard face, the heat transfer part of the board adheres to the side of the backboard side heat pipe. As a result, the generated heat of the heater element is transferred to the backboard side through the heat pipe, the heat transfer part and backboard side heat pipe.

THE PRECEDING TECHNICAL DOCUMENT

Patent Document

[Patent document 1] Japanese Patent Application Laid-Open No. 2001-156483 (in particular, paragraphs 0030 to 0033 and FIG. 3)

[Patent document 2] Japanese Patent Application Laid-Open No. 1998-209660 (in particular, paragraphs 0027 and 0028 and FIGS. 13 to 16)

DESCRIPTION OF THE INVENTION

Problem to be Solved by the Invention

However, in the technology described in the patent document 1, the joint surface of an edge and a heat sink surface of the plate type heat pipe is installed in parallel to the surface of the plate type heat pipe and along the insert and removal direction of the plate type heat pipe. For this reason, when the plate type heat pipe module is loaded on the heat sink plate, the friction is generated between the edge of the plate type heat pipe and the joint surface of the heat sink surface. For this reason, it is easy for a bruise to be formed on the surface of the joint surface of the edge of the plate type heat pipe and the heat sink surface. And by the corrosion of the bruise of this joint surface, the thermal resistance between the both joint surfaces becomes large. As a result, there has been a problem that the heat of the heater element cannot be transferred to a heat sink surface sufficiently and the generated heat of the heater element cannot be radiated sufficiently.

In the technology described in the patent document 2, the problem has been solved which is caused by the technology described in the document 1 since the joint surface of the heat transfer part of the board and the face of the backboard side heat pipe is installed in vertical to the side of the board. However, in the technology described in the patent document 2, the heat transfer part needs to be formed with the different member form the heat pipe so as to project vertically to the board face. In this way, the heat transfer part interposes as another member between the heat pipe and the backboard side heat pipe. For this reason, the thermal resistance between the heat pipe and the backboard side heat pipe becomes large in comparison with the case of the direct joint between the heat pipe and the backboard side heat pipe. As a result, there has been a problem that the heat of the heater element cannot be transferred to the backboard side heat pipe sufficiently and the generated of the heater element cannot be radiated sufficiently.

The present invention has been made from the view of such circumstances and the object of the present invention is to provide the technology which enables to radiate the generated heat of the heater element efficiently.

Means for Settling a Problem

An electronic substrate according to the present invention includes a tabular base material which can install a heater element and a cooling structure which cools the generated heat of the heater element, in which the base material is possible to be plugged in and out in a case to the direction which is almost parallel to the surface of the base material, the cooling structure provided for the base material is equipped with a first heat radiation part with a hollow shape that radiates the generated heat of the heater element installed in the base material, and a heat transfer part that transfers the generated heat of the heater element to the first heat radiation part, and the first heat radiation part is equipped with a first joint surface that is a face which is almost vertical to the insert and removal direction of the base material, and connects with a second heat radiation part installed thermally in the case through the first joint surface.

An electronic apparatus according to the present invention includes an electronic substrate and a case which accommodates the electronic substrate, in which the electronic substrate has a tabular base material that can install a heater element and a cooling structure that cools the generated heat of the heater element, and the base material can be plugged in/out on a case in the direction which is almost parallel to the surface of the base material, the cooling structure installed in the base material is equipped with the first heat radiation part with a hollow shape that radiates the generated heat of the heater element installed on the base material, and a heat transfer part that transfers the generated heat of the heater element to the first heat radiation part, in which the first heat radiation part is equipped with a first joint surface that is a face which is almost vertical to the insert and removal direction of the base material and connects the second heat radiation part set up to the case thermally through the first joint surface.

The Effect of the Invention

According to an electronic substrate according to the present invention, the generated of a heater element can be radiated more efficiently.

EMBODIMENT FOR CARRYING OUT THE INVENTION

The First Embodiment

Figure 1:
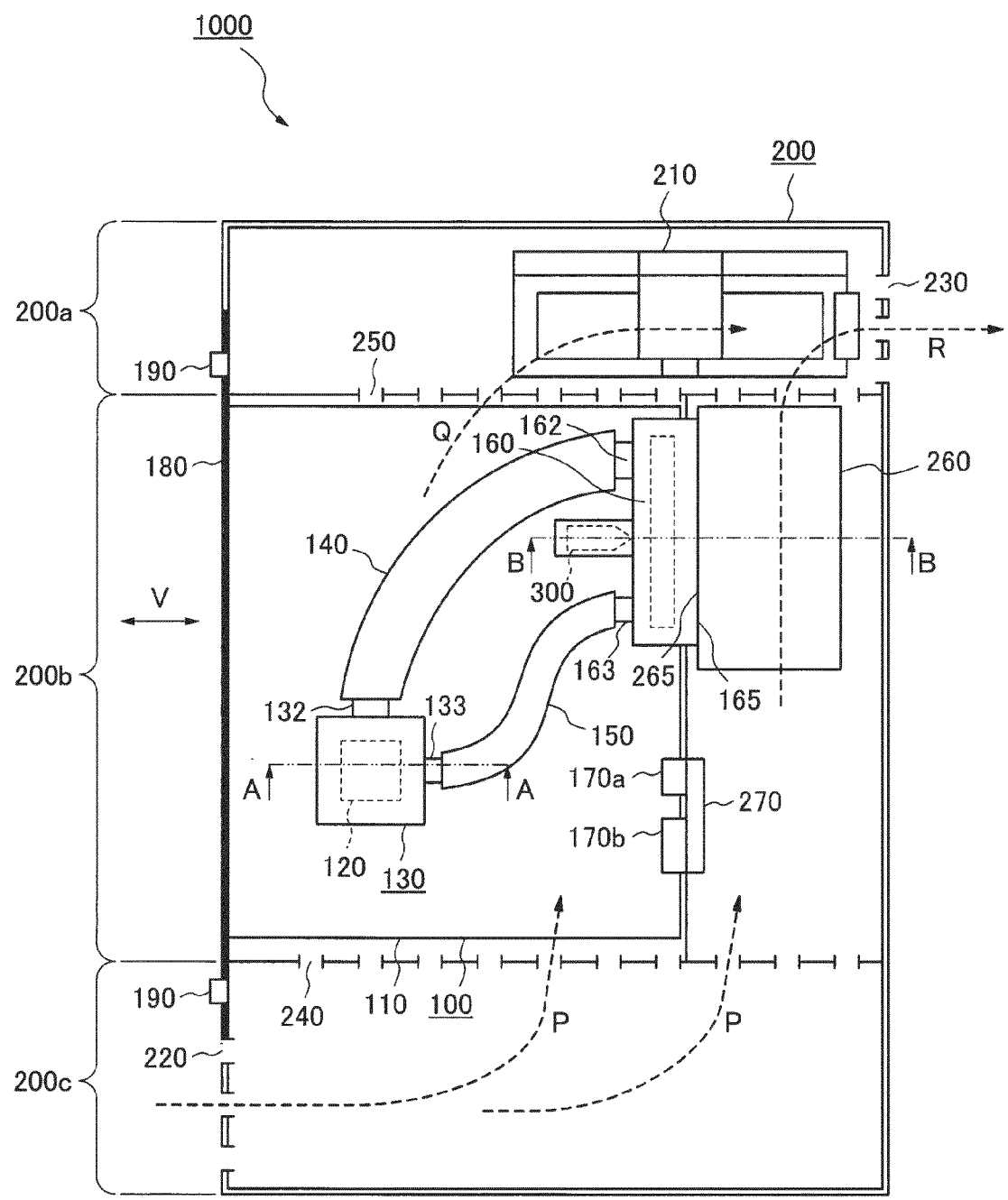
FIG. 1 is a side penetration figure which shows the composition of the electronic apparatus in the first embodiment of the present invention.
Figure 2:
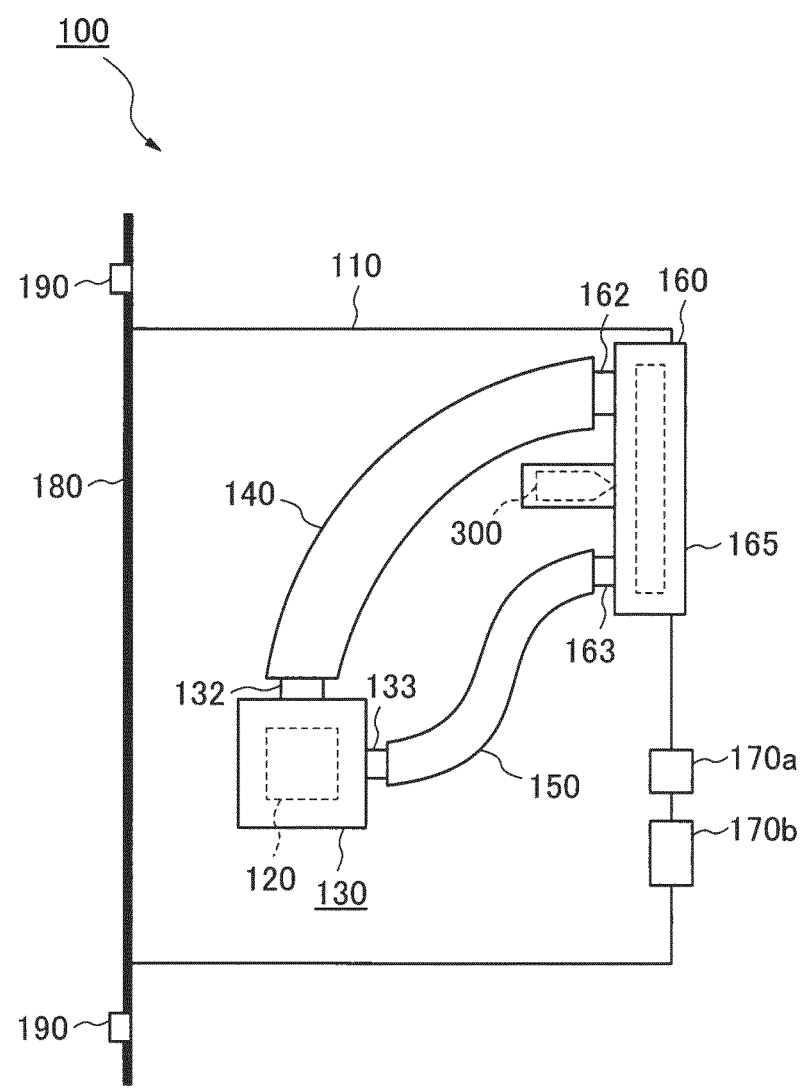
FIG. 2 is a plan view which shows the composition of the electronic substrate in the first embodiment of the present invention.
Figure 3:
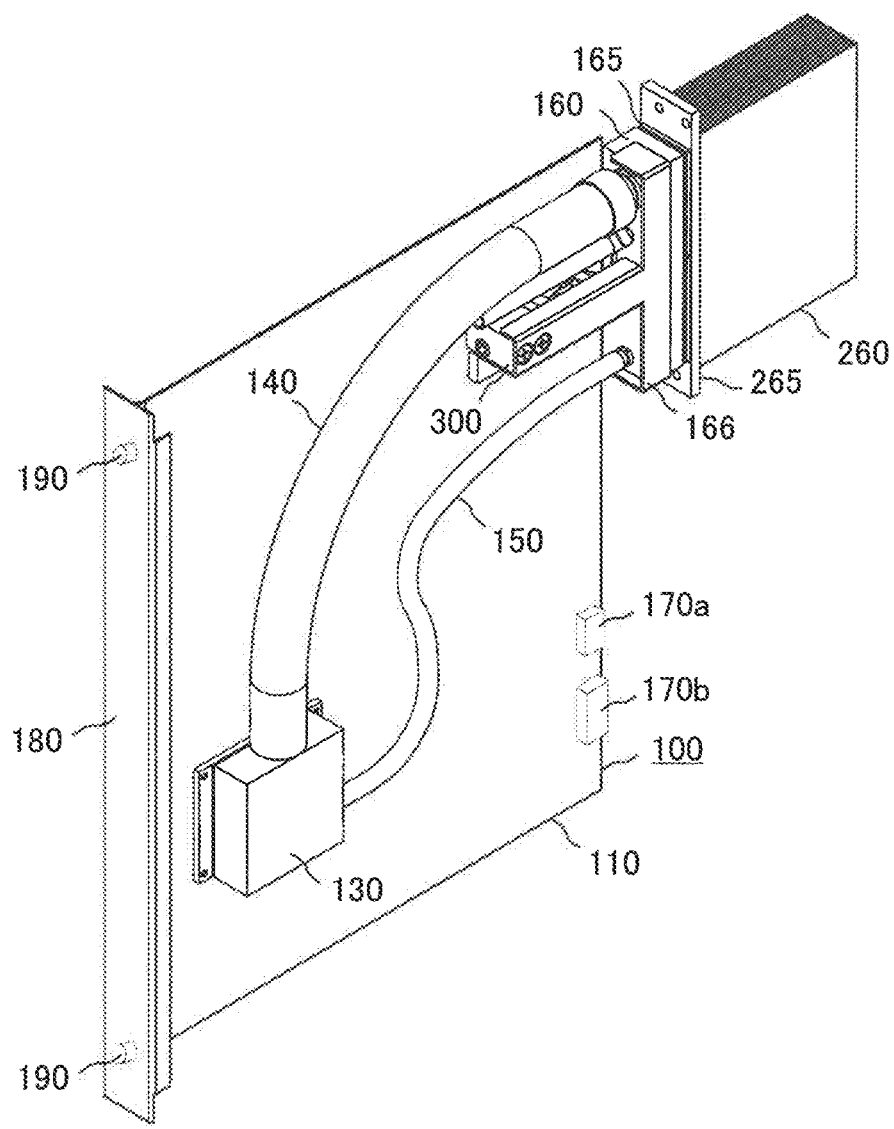
FIG. 3 is a perspective view which shows an electronic substrate and the surrounding configuration in the first embodiment of the present invention.
Figure 4:
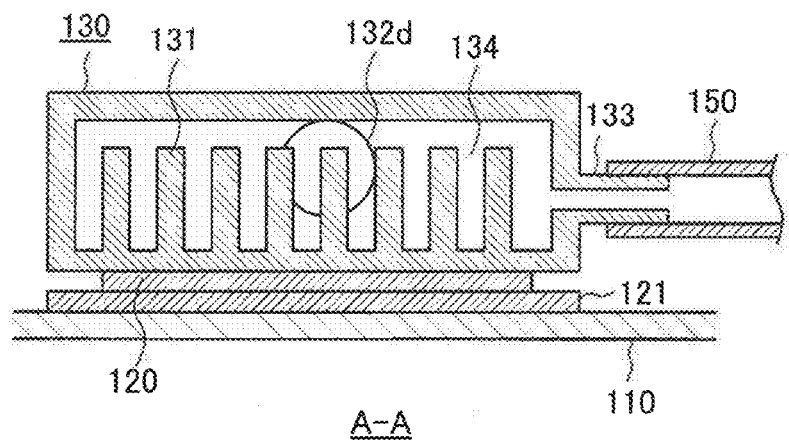
FIG. 4 is a cross section which shows a section when cutting by the A-A section of FIG. 1.
Figure 5:
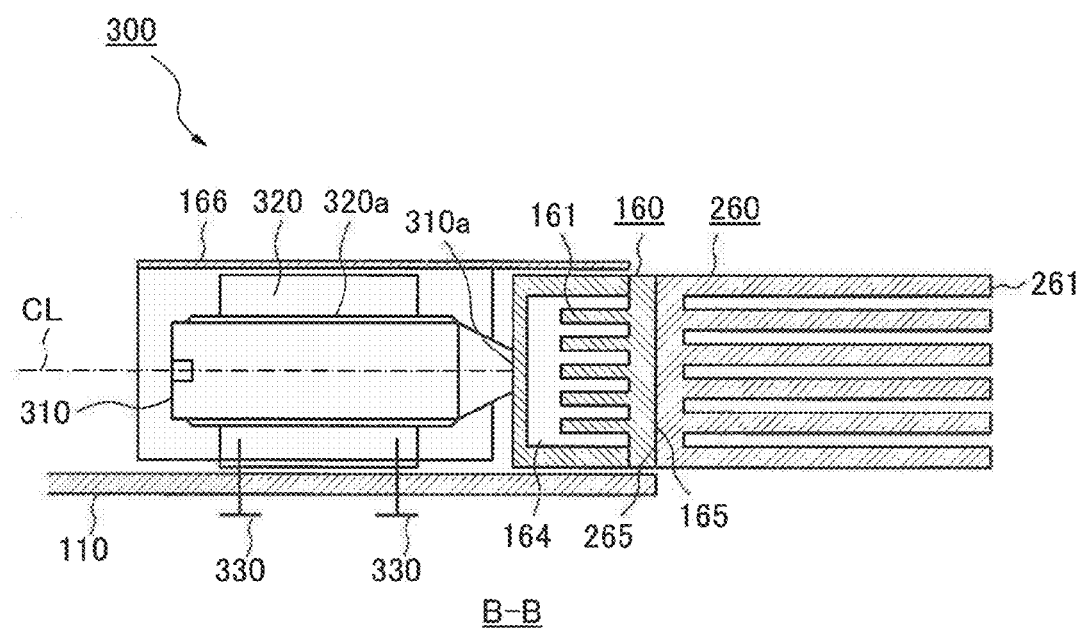
FIG. 5 is a cross section which shows a section when cutting by the B-B section of FIG. 1.

FIG. 1 indicates a configuration of the side view of an electronic apparatus 1000 in the first embodiment of the present invention in a penetration manner. FIG. 2 is a plan view which shows the composition of the electronic substrate 100 in the first embodiment of the present invention. FIG. 3 is a perspective view which shows an electronic substrate 100 and its surrounding configuration. FIG. 4 indicates a section when cutting by the A-A section of FIG. 1. FIG. 5 indicates a section when cutting by the B-B section of FIG. 1.

As shown in FIG. 1, at least, the electronic apparatus 1000 is composed to include an electronic substrate 100 and a case 200. The case 200 accommodates the electronic substrate 100. The electronic substrate 100 is installed along the face almost parallel to the face of a base material 110 so that the case 200 can be inserted and removed. The insert and removal direction V of the electronic substrate 100 is shown in FIG. 1. That is, by inserting the electronic substrate 100 in the case 200 along the face almost parallel to the base material 110, the electronic substrate 100 can be installed in the case 200. Conversely, by removing the electronic substrate 100 from the case 200 along the face almost parallel to the base material 110, the electronic substrate 100 can be removed from the case 200. Here, first, the configuration of the case 200 is described, and the configuration of the electronic substrate 100 is described after that.

As shown in FIG. 1, the case 200 has three areas of an exhaust area 200a, a substrate mount area 200b and an intake area 200c. The fan part 210 is installed in the exhaust area 200a. A plurality of intake vents 220 are formed in a front side (the left side of FIG. 1) of the intake area 220c. A plurality of exhaust ports 230 are formed in a rear side (the right side of FIG. 1) in the exhaust area 200a. A plurality of first vents 240 are formed between the intake area 200c and the substrate mount area 200b. A plurality of second vents 250 are formed between the substrate mount area 200b and the exhaust area 200a.

In the case 200, first, the air outside the case 200 is breathed in from the intake vent 220 when the fan part 210 is operated. Next, the air breathed in from the intake vent 220 enters in the substrate mount area 220b (arrow P) through the first vent 240 and then enters in the exhaust area 200a (arrow Q) through the second vent 250. And the air in the exhaust area 200a is discharged in a rear side of the case 200 through an exhaust port 230 (arrow R). In this way, by operating the fan part 210, the electronic apparatus 1000 breathes the air outside the case 200 in from the front side of the case 200 and discharges the air breathed in the rear side of the case 200 through the intake area 200c, the substrate mount area 200b and the exhaust area 200a. As a result, the heat of the electronic substrate 100 accommodated in the case 200 has been cooled using the air outside the case 200.

As shown in FIG. 1, the second heat radiation part 260 is installed in the rear side inside the case 200 among the substrate mount area 200b. For example, this second heat radiation part 260 is formed by a thermal conductivity member such as aluminum or copper and is desired more to be formed by the member whose thermal resistance is small.

Furthermore, the second joint surface 265 is formed in an end part of the second heat radiation part 260 as a face of which the second heat radiation part 260 is composed. As mentioned after, this second joint surface 265 joins together to the first joint surface 165 of the first heat radiation part 160 of the electronic substrate 100 and radiates the generated heat of the electronic parts on the electronic substrate 100.

As shown in FIG. 5, a plurality of the tabular case side fin parts 261 are set up to the second heat radiation part 260. As described after in detail, the case side fin part 261 radiates the heat transferred from the first heat radiation part 160 by joining the first joint surface 165 and the second joint surface 265 together. Further, here, it explained that the shape of the case side fin part 261 has been the tabular shape. However, in order to fulfil the function to spread the heat, the case side fin part 261 may expand the surface area and may be formed into the flower arrangement upward-pointing pin holder shape, the stick shape or the bellows shape, for example.

A connector 270 is installed in the substrate mount area 200b of the case 200. The connector 270 connects electrically between the electronic substrate 100 and the circuit in the case 200 (not shown) by fitting connectors 170a and 170b together mentioned after.

Next, the configuration of the electronic substrate 100 will be described based on the figures.

As shown in FIG. 2 and FIG. 3, the electronic substrate 100 is composed to include a base material 110, a heater element 120, a boiling heat receiving part 130, a tube 140 for vapor, a tube 150 for liquid, the first heat radiation part 160, connectors 170a and 170b, a front board 180 and a screw adhering part 190. Further, the heater element 120 can be installed and removed to the electronic substrate 100.

The basic structure of the cooling structure (called the evaporation cooling structure.) will be described before the description of each composition of the electronic substrate 100. In this cooling structure, the generated heat of a heater element 120 is cooled by circulating a refrigerant while performing the phase change (liquid phase to vapor phase) between the boiling heat receiving part 130 and the first heat radiation part 160. As shown in FIG. 2 and FIG. 3, the boiling heat receiving part 130 and the first heat radiation part 160 are connected by the tube 140 for vapor and the tube 150 for liquid. The inside of the boiling heat receiving part 130 and the first heat radiation part 160 which is formed in a hollow shape becomes a cavity as mentioned after in detail. The refrigerant (not shown) has been shut in a tightly closed state in the space (hereinafter, this space is referred to as a space of the cooling structure) formed by an inner cavity of the boiling heat receiving part 130 and the first heat radiation part 160, the tube 140 for vapor and the tube 150 for liquid.

This refrigerant circulates between the boiling heat receiving part 130 and the first heat radiation part 160 in a tightly closed state in the space of the cooling structure through the tube 140 for vapor and the tube 150 for liquid. The refrigerant includes high polymer materials, for example, and has the characteristic that it is vaporized when becoming hot and liquefied when becoming cold. For example, the fluorine type refrigerant of series 7000 of Novec (registered trademark) of Sumitomo 3M Corp. can be used as the refrigerant. In order to load this refrigerant into the electronic apparatus 1000 of the present invention, first, a refrigerant is poured in the space with the cooling structure. Next, the air is excluded from the space with the cooling structure using a vacuum pump (not shown). As a result, the refrigerant has been shut in a tightly closed state in the space with the cooling structure. The pressure in the space of said cooling structure will be 0.065 (MPa), and the boiling point of the refrigerant tightly closed in the space will be 25 (° C.) when using the fluorine type refrigerant of Novec series 7000. When the cooling structure is put under the environment of 25 (° C.), the refrigerant boils and the vapor occurs at almost the same time of the start of heat generation of the heater element 120 if the boiling heat receiving part 130 touches the heater element 120. As a result, the cooling structure works as a cooling module and begins to cool the generated heat of the heater element 120.

Further, at least, the boiling heat receiving part 130 and the tube 140 for vapor compose the heat transfer part of the present invention. This heat transfer part performs the function to transfer the generated heat of the heater element 120 to the first heat radiation part 160.

Next, each member of which the electronic substrate 100 is composed will be described specifically. The base material 110 is a printed wiring board formed into the tabular. This base material 110 is constituted so as to load the heater element 120. An incombustible member such as the glass epoxy, for example, is used as the material of the base material 110.

The heater element 120 is a device which generates the high heat when working such as CPU and MCM, for example. As shown in FIG. 4, the heater element 120 is installed in the base material 110 through the socket 121 for heater elements.

The boiling heat receiving part 130 receives the generated heat of the heater element 120. As shown in FIG. 4, the boiling heat receiving part 130 is installed on the heater element 120. Further, the material of the boiling heat receiving part 130 is formed by a heat transfer property member such as aluminum and copper for example.

The boiling heat receiving part 130 has the refrigerant boiling part 134 in the internal space. In the refrigerant boiling part 134, the refrigerant is vaporized by the generated heat of the heater element 120. A plurality of the tabular boiling heat receiving part side fin parts 131 are installed in the refrigerant boiling part 134 of the boiling heat receiving part 130. The boiling heat receiving part side fin part 131 lowers the temperature of the heater element 120 by radiating the generated heat of the heater element 120. Further, here, it has been explained that the shape of the boiling heat receiving part side fin part 131 has been made the plate shape. However, in order to fulfil the function to spread the heat, the boiling heat receiving part side fin part 131 may expand the surface area and may be formed into the flower arrangement upward-pointing pin holder shape, the stick shape or the bellows shape, for example.

The boiling heat receiving part 130 includes a steam tube 132 and a liquid tube 133, further, as shown in FIG. 2 and FIG. 3. The steam tube 132 hits the joint of the boiling heat receiving part 130 and the tube 140 for vapor. The liquid tube 133 hits the joint of the boiling heat receiving part 130 and a tube 150 for liquid. In FIG. 4, the section of the liquid tube 133 is indicated, and an opening 132a which constitutes an end face of the steam tube 132 is indicated. The steam tube 132 is connected to the first heat radiation part 160 through the tube 140 for vapor. The liquid tube 133 is connected to the first heat radiation part 160 through the tube 150 for liquid. Further, the steam tube 132 and the liquid tube 133 may be formed by the same material as the boiling heat receiving part 130 in general or may be formed by the material different from the boiling heat receiving part 130.

In order to circulate through a refrigerant, the tube 140 for vapor and the tube 150 for liquid are used between the boiling heat receiving part 130 and the first heat radiation part 160. A tolerant member is used so that the deterioration and transformation do not occur in the material of the tube 140 for vapor and the tube 150 for liquid by a selected refrigerant.

The first heat radiation part 160 is installed in the edge side of the base material 110 as shown in FIG. 2 and FIG. 3. The first heat radiation part 160 radiates the generated heat of the heater element 120 by cooling the gas of the refrigerant poured through the tube 140 for vapor from the boiling heat receiving part 130. The heat transfer property member such as aluminum and copper for example are used for the material of the first heat radiation part 160.

The first heat radiation part 160 is formed in a hollow shape as shown in FIG. 5, and it has a condensing part 164 in the internal space. In the condensing part 164, the refrigerant vaporized by the generated heat of the heater element 120 is cooled and liquefies. A plurality of the first tabular heat radiation part side fin parts 161 are installed in the condensing part 164 of the first heat radiation part 160. The first heat radiation part side fin part 161 makes the temperature of the heater element 120 lower by radiating the heat of the refrigerant gas poured through the tube 140 for vapor from the boiling heat receiving part 130. Further, here, in terms with the shape of the first heat radiation part side fin part 16, it may also be formed into the flower arrangement upward-pointing shape.

The steam tube 162 and the liquid tube 163 are further included in the first heat radiation part 160 as shown in FIG. 2 and FIG. 3. The steam tube 162 corresponds to the heat transfer part of the present invention and the joint part of the first heat radiation part 160. The steam tube 162 is connected to the boiling heat receiving part 130 through the tube 140 for vapor. The liquid tube 163 is connected to the boiling heat receiving part 130 through the tube 150 for liquid. Further, the steam tube 162 and the liquid tube 163 may be formed in general by the same material as the first heat radiation part 160 or may be formed as a different form by the material different from the first heat radiation part 160.

As shown in FIG. 2 and FIG. 5, the first heat radiation part 160 is equipped with the first joint surface 165 that is a face which is almost vertical to the surface of the base material 110. The first joint surface 165 is installed so as to oppose to the second joint surface 265 of which the second heat radiation part 260 is composed. The first joint surface 165 is almost vertical to the insert and removal direction V (referred to FIG. 1) of the electronic substrate 100.

The connectors 170a and 170b which are mounted on the base material 110 are electrically connected to the electrode pattern formed on the base material 110. By fitting the connectors 170a and 170b into a connector 270 installed on the case 200, the electronic substrate 100 and the electronic circuit in the case 200 (not shown) are connected electrically each other.

As shown in FIG. 1 to FIG. 3, the front board 180 is installed in the opposite side edge of an edge where the first heat radiation part 160 among base material 110 has been set up. The front board 180 is installed in the direction which is almost vertical to the side of the base material 110 along the end face of the base material 110. When the electronic substrate 100 is accommodated in the case 200, the front board 180 composes a front (left side of FIG. 1) of the electronic apparatus 100. An installation screw part 190 is installed in the front board 180. A screw hole (not shown) for the installation screw part 190, which is a front side (left side of FIG. 1) of the case 200, is formed in the position corresponding to the installation screw part 190. After installing the installation screw part 190 in the screw hole in a front side of the case 200, the front board 180 of the electronic substrate 100 is held in a front side of a case 200 by tightening the screw of the installation screw part 190.

Here, the electronic substrate 100 has a pressing part 300 as shown in FIG. 2 and FIG. 5. The pressing part 300 presses the first heat radiation part 160 for the second heat radiation part 260 so that the first joint surface 165 and the second joint surface 265 may be connected thermally. Further, that the first joint surface 165 and the second joint surface 265 are connected thermally implies that the heat in the side of the first joint surface 165 and the heat in the side of the second joint surface 265 are enabled to move each other.

As shown in FIG. 5, the pressing part 300 has a screw part 310 installed on the surface of the base material 110 at least. Here, the press screw part 310 is installed on the surface of a substrate 110 through a screw guide 320 and a screw guide fixed screw 330. Specifically, the screw guide 320 is held by the screw guide fixed a screw 330 in the base material 110. A screw hole 320a is formed in the direction which is almost vertical way to the first and the second joint surfaces 165 and 265 along the surface of the base material 110. When the press screw part 310 is installed in the screw hole 320a of the screw guide 320, the center axis CL of the press screw part 310 is arranged in the direction which is almost vertical to the first and the second joint surfaces 165 and 265.

As shown in FIG. 3 and FIG. 5, the cover for the first heat radiation part 166 is installed so as to cover a part of the first heat radiation part 160 and the screw guide 320. As shown in FIG. 3, by enclosing three sides (front side, upper side and lower side in FIG. 3) of the first heat radiation part 160, the cover for first heat radiation part 166 is regulated so that the first heat radiation part 160 may move to the almost parallel direction to the insert and removal direction of the surface of the base material 110 and the electronic substrate 100. The cover for first heat radiation part 166 is fixed on the screw guide 320 (a fixing means is not shown). As mentioned before, the first heat radiation part 160 is connected to the boiling heat receiving part 130 by the tube 140 for vapor and the tube 150 for liquid. For this reason, the first heat radiation part 160 is held without coming off the base material 110 by setting the length or the like of the tube 140 for vapor and the tube 150 for liquid so that a part of the first heat radiation part 160 may always be arranged inside the cover for first heat radiation part 166.

And by tightening the press screw part 310, a tip portion 310a of the press screw part 310 presses the first heat radiation part 160 to the second heat radiation part 260. As a result, the first joint surface 165 and the second joint surface 265 join each other while being pressed. As a result, the heat of the first heat radiation part 160 can be transferred to the second heat radiation part 260 efficiently.

Next, the mechanism to radiate the heat emitted from the heater element 120 of the electronic substrate 100 will be described specifically using the boiling heat receiving part 130, the first heat radiation part 160 and the second heat radiation part 260. Further, here, it is supposed that the first joint surface 165 of the first heat radiation part 160 and the second joint surface 265 of the second heat radiation part 260 are already in the state that they adhere while being pressed each other. That is, in this state, the first heat radiation part 160 and the second heat radiation part 260 connect thermally each other through the first and the second joint surfaces 165 and 265.

First, as shown in FIG. 4, the boiling heat receiving part 130 receives the generated heat of the heater element 120. As a result, the refrigerant in the refrigerant boiling part 134 of the boiling heat receiving part 130 is vaporized. In the boiling heat receiving part 130, the refrigerant boiling part side fin part 131 lowers the temperature of the heater element 120 by radiating the heat received directly from the heater element 120 and the heat of a vaporized refrigerant.

Next, as shown in FIG. 2, the vaporized refrigerant flows into the first heat radiation part 160 through the tube 140 for vapor. In the condensing part 164 of the first heat radiation part 160, the first heat radiation part side fin part 161 radiates the heat of the refrigerant gas which has poured. As a result, the refrigerant is liquefied and the generated heat of the heater element 120 is radiated. By the radiation with the first heat radiation part side fin part 161, the refrigerant in the condensing part 164 of the first heat radiation part 160 is liquefied. This liquefied refrigerant flows into the boiling heat receiving part 130 again through the tube 150 for liquid.

In this way, in the electronic substrate 100, the refrigerant vaporized in the boiling heat receiving part 130 is cooled and liquefied in the first heat radiation part 160, and this liquefied refrigerant has poured in the boiling heat receiving part 130 again. As a result, this refrigerant circulates in the electronic substrate 100 while performing the phase change (vapor phase to liquid phase), and the generated heat of the heater element 120 can be radiated efficiently. Because the boiling heat receiving part side fin part 131 and the first heat radiation part side fin part 161 are installed respectively in the boiling heat receiving part 130 and the first heat radiation part 160, the generated heat of the heater element 120 is radiated more efficiently.

In the present invention, a pressing part 300 is installed and the first joint surface 165 of the first heat radiation part 160 and the second joint surface 265 of the second heat radiation part 260 adhere while being pressed each other. For this reason, the heat of the heater element 120 poured into the first heat radiation part 160 through the refrigerant transfers to the second heat radiation part 260. As a result, the generated heat of the heater element 120 can be radiated more efficiently.

Figure 6:
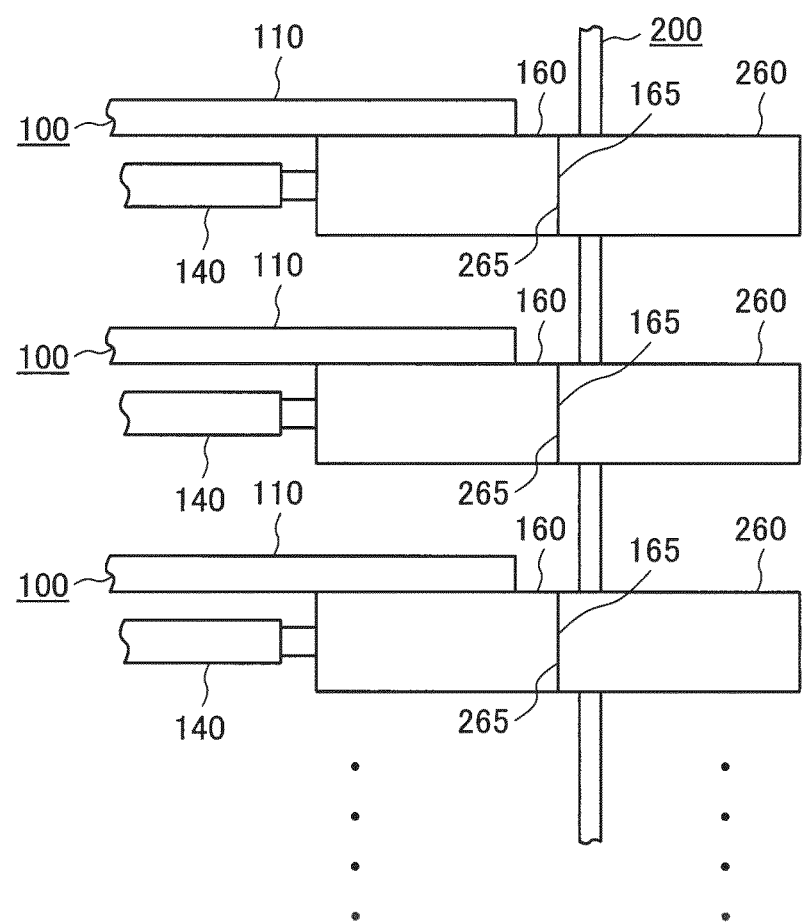
FIG. 6 is a figure which conceptually shows a connection structure of the first and the second heat radiation parts when viewing from the surface side of the case.
Figure 7:
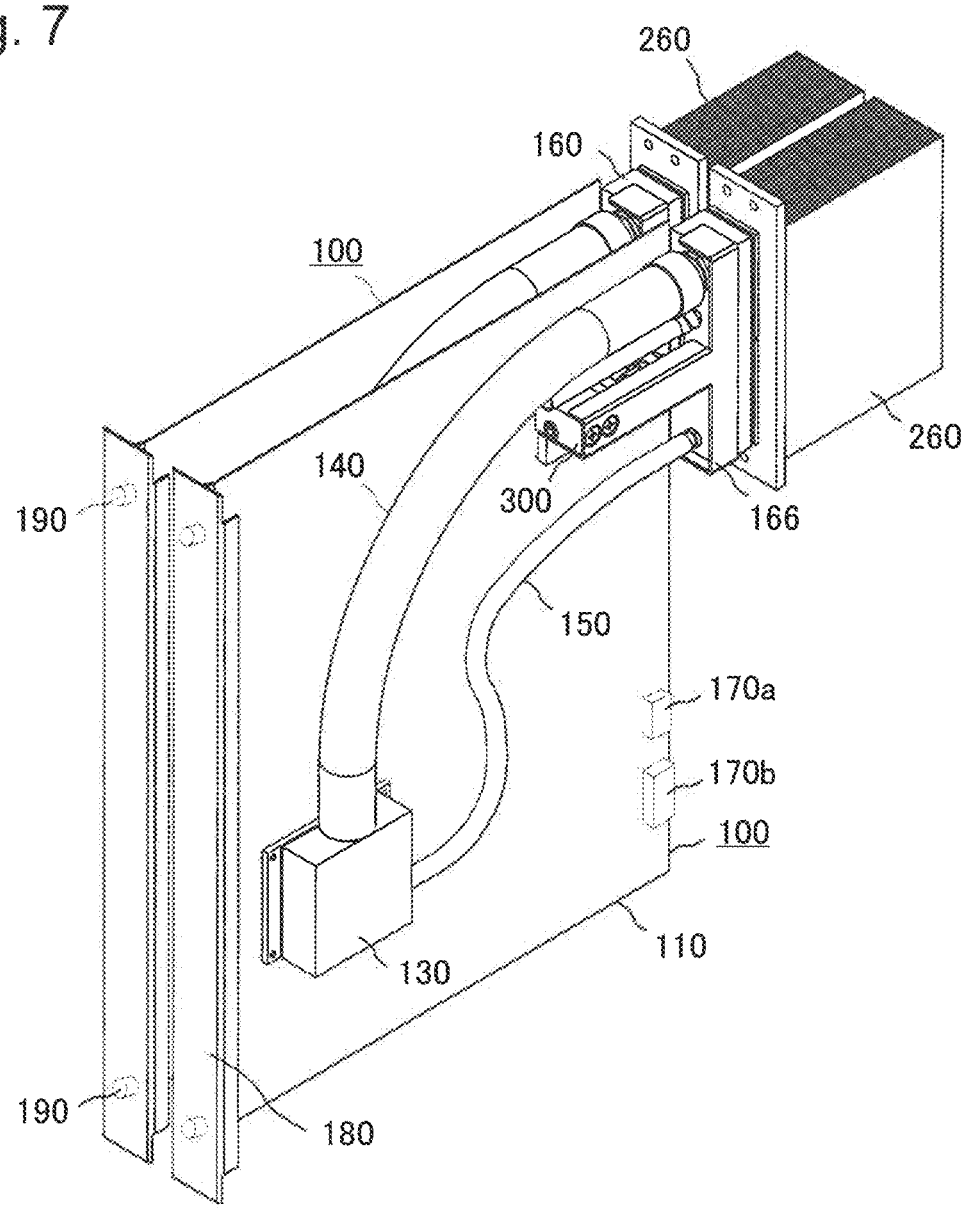
FIG. 7 is a perspective view for explanting a connection structure of the first and the second heat radiation parts.

FIG. 6 conceptually shows the connection structure of the first and the second heat radiation parts 160 and 260 when being viewed from the upper surface side of the case 200. FIG. 7 is a perspective view which illustrates the connection structure of the first and the second heat radiation parts 160 and 260. Further, in the convenience to create a drawing, only two pieces of the electronic substrates 100 are illustrated in FIG. 7.

As shown in FIG. 6 and FIG. 7, a plurality of second heat radiation parts 260 are installed in the case 200. Each of a plurality of the first heat radiation part 160 are arranged so as to oppose each of a plurality of second heat radiation parts 260 respectively. At that time, the first joint surface 165 of the first heat radiation part 160 and the joint surface 265 of the second heat radiation part 260 adhere each other by the depressing with the pressing part 300 (not shown in FIG. 6 and referred to FIG. 2 and FIG. 5). As a result, because each of a plurality of the first heat radiation part 160 and each of a plurality of the second heat radiation part 260 connect thermally each other in each of the first joint surface 165 and each of the second joint surface 265 in one case 200, the generated heat of each heater element 110 on a plurality of electronic substrates 100 can be radiated efficiently in one case 200.

Figure 8:
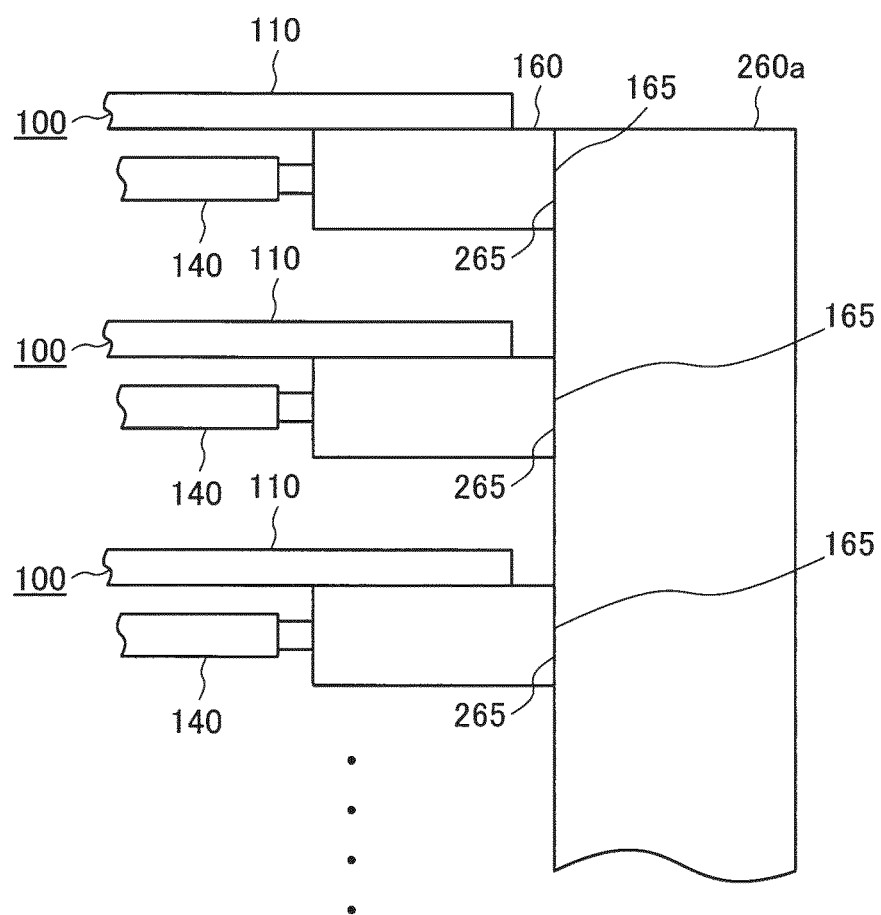
FIG. 8 is a figure which shows conceptually another example of a connection structure of the first and the second heat radiation parts when viewing from the surface side of the case.
Figure 9:
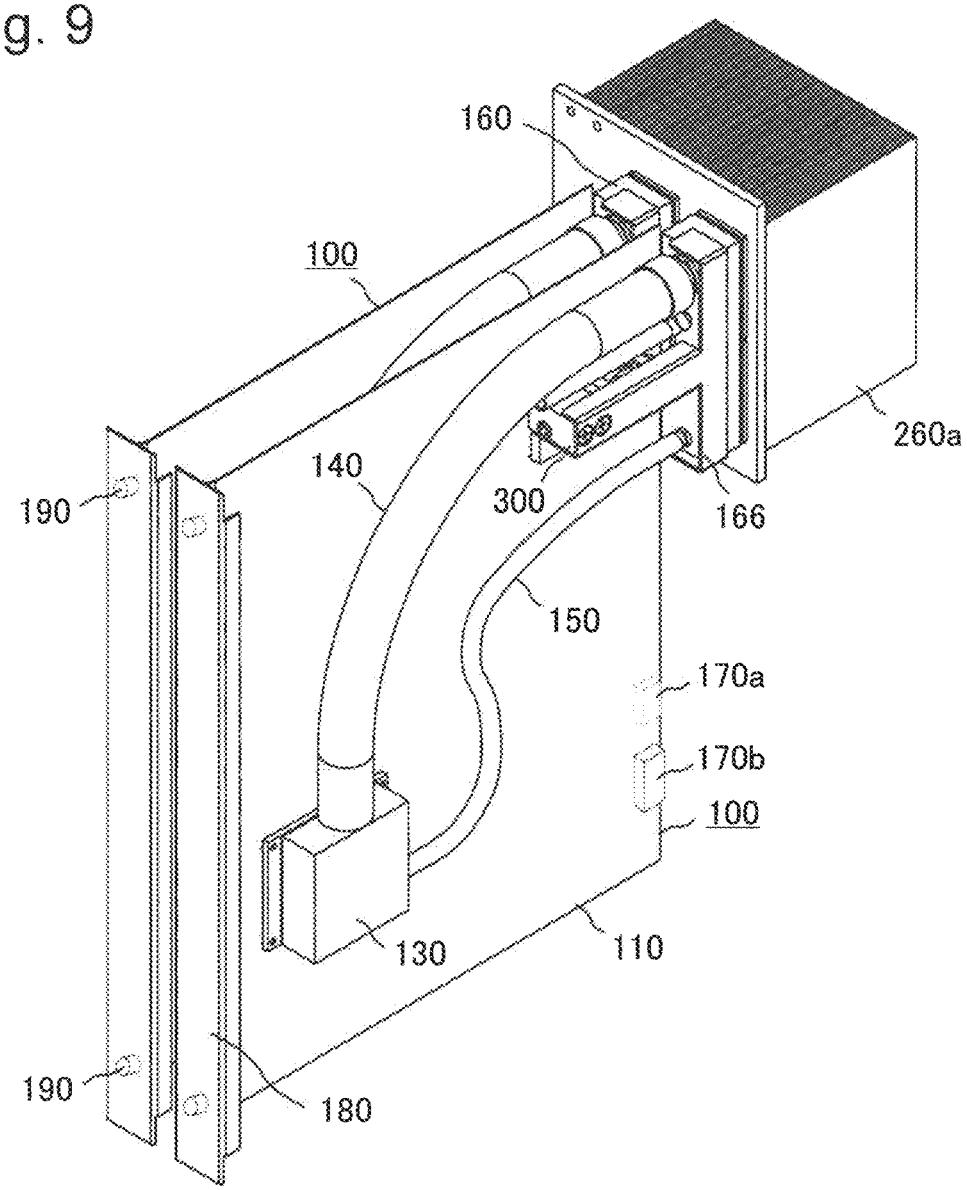
FIG. 9 is a perspective view which illustrates another example of the connection structure of the first and the second heat radiation parts.

FIG. 8 conceptually shows another example of the connection structure of the first and the second heat radiation parts 160 and 260 when viewing from the upper surface side of the case 200. FIG. 9 is a perspective view which illustrates another example of the connection structure of the first and the second heat radiation parts 160 and 260. Further, in the convenience to create a drawing, only two pieces of the electronic substrates 100 are illustrated in FIG. 9.

FIGS. 6 and 7 are contrasted to FIGS. 8 and 9. In FIG. 6 and FIG. 7, the first heat radiation part 160 and the second heat radiation part 260 are composed so as to be touched in an 1 to 1 manner each other. In contrast, in FIG. 8 and FIG. 9, a plurality of the first heat radiation parts 160 is composed so as to touch one of the second heat radiation parts 260. That is, as shown in FIG. 8 and FIG. 9, the second joint surface 265 is formed into the second heat radiation part 260 in order to join it to a plurality of first joint surfaces 165. A plurality of the first joint surfaces 165 and one of the second joint surfaces 265 adhere each other and are connected thermally by the depressing with the pressing part 300 (not shown in FIG. 8 and referred to FIG. 2 and FIG. 5). As a result, since the first heat radiation part 160 and the second heat radiation part 260 are not needed to be installed in a 1 to 1 manner, an electronic apparatus can be composed easily.

As mentioned before, the electronic substrate 100 in the first embodiment of the present invention has the tabular base material 110 and the cooling structure. The base material 110 can load the heater element 120. The case 200 can plug in and out the electronic substrate 100 is insertable and removable in the direction almost parallel to the surface of the base material 110 in the case 200. The cooling structure cools the heater element 120. The cooling structure is installed on the tabular base material 110, and includes the first heat radiation part 160 with a hollow shape and the heat transfer part (the boiling heat receiving part 130 and the tube 140 for vapor) at least. The first heat radiation part 160 with a hollow shape radiates the generated heat of the heater element 120 which is loaded to the base material 110. The heat transfer part is composed of the boiling heat receiving part 130 and the tube 140 for vapor. This heat transfer part transfers the generated heat of the heater element 120 to the first heat radiation part 160. The first heat radiation part 160 has the first joint surface 165 formed along a face which is almost vertical to the insert and removal direction of the base material 110. And the first heat radiation part 160 is connected to the second heat radiation part 260 set up to a case 200 thermally through the first joint surface 165.

Thus, in an electronic substrate 100 in the first embodiment of the present invention, generated heat of a heater element 120 is transferred by the heat transfer part to the first heat radiation part 160. And the first heat radiation part 160 is connected to the second heat radiation part 260 of a case 200 thermally through the first joint surface 165. The first joint surface 165 of the first heat radiation part 160 is vertical to the insert and removal direction of the base material 110 almost. The base material 110 is insertable and movable to the case 200 at the face which is almost parallel to the base material 100. As a result, when the base material 100 is inserted in the base 200 along the face (insert and removal direction V of the electronic substrate 100) which is almost parallel to the surface of the base material 100, the first heat radiation part 160 joins to the second heat radiation part 260 thermally through the first joint surface 165. By this joining, the generated heat of the heater element 12 is transferred from the first heat radiation part 160 to the second heat radiation part 260 and radiated.

At that time, the first heat radiation part 160 and the second heat radiation part 260 are connected thermally each other through the first joint surface 165 that is a face which is almost vertical in the insert and removal direction of the electronic substrate 100. That is, in the present invention, the first heat radiation part 160 and the second heat radiation part 260 are not joined in a face which is almost parallel to the insert and removal direction of the electronic substrate 100 unlike the technology described in patent document 1. For this reason, it can be suppressed that the friction forms between the faces in which the first heat radiation part 160 and the second heat radiation part 260 join each other at the time of the insert and removal of the electronic substrate 100. Accordingly, because it becomes difficult for a bruise to be formed on the surface of the joint surface of the first heat radiation part 160 and the second heat radiation part 260 and it does not also cause the increase of the thermal resistance by the corrosion in the joint surface, the generated heat of the heater element 120 can be transferred to the second heat radiation part 260 with high efficiency.

Further, the first heat radiation part 160 with a hollow shape connects directly with the second heat radiation part 260 of the case 200 thermally through the first joint surface 165 of the first heat radiation part 160. That is, in the present invention, it does not need to install another member like the heat transfer part described in the patent document 2, and connect the first heat radiation part 160 with a hollow shape and the second heat radiation part 260 thermally. For this reason, the thermal resistance between the first heat radiation part 160 with a hollow shape and second heat radiation part 260 can be suppressed in low, and the generated heat of the heater element 120 can be transferred to the second heat radiation part 260 with high efficiency.

In this way, because the first heat radiation part 160 and the second heat radiation part 260 are connected thermally directly through the first joint surface 165 that is a face which is almost vertical in the insert and removal direction of the electronic substrate 100 according to the electronic substrate 100 in the first embodiment of the present invention, the generated heat of the heater element 120 can be radiated more efficiently.

Further, in the electronic substrate 100 in the first embodiment of the present invention, the heat transfer part (boiling heat receiving part 130 and tube 140 for vapor) transfers the generated heat of the heater element 120 to the first heat radiation part 160 through a refrigerant. As mentioned before, the first heat radiation part 160 has the condensing part 164 with a hollow shape. This condensing part 164 cools and condenses the refrigerant which is vaporized by the generated heat of the heater element 120 and flows in. In this way, by using a refrigerant, the generated heat of the heater element 120 can be transferred to the first heat radiation part 160 efficiently.

In the electronic substrate 100 in the first embodiment of the present invention, the pressing parts 300 are installed in addition. This pressing part 300, which is a face of which the second heat radiation part 260 is composed, presses the first heat radiation part 160 for the second heat radiation part 260 so that the second joint surface 265 that opposes to the first joint surface 165 and the first joint surface 165 may connect thermally each other. As a result, because the first joint surface 165 and the second joint surface 265 are connected thermally in the state pressurized each other, the generated heat of the heater element 120 transferred by the heat transfer part to the first heat radiation part 160 is cut with heat transfer efficiently in the second heat radiation part 260. As a result, the generated heat of the heater element 120 can be radiated more efficiently.

In the electronic substrate 100 in the first embodiment of the present invention, the pressing part 300 presses the position which corresponds to a central portion almost of the first joint surface 165. As a result, the load caused by the pressing part 300 can be applied to the second heat radiation part 260 efficiently.

In the electronic substrate 100 in the first embodiment of the present invention, the pressing part 300 has a screw part 310 at least. This screw part 310 is installed on the base material face 110. The center axis CL of the screw part 310 is arranged in the direction which is almost vertical to the first and the second joint surfaces 165 and 265. And a tip portion 310a of the screw part 310 presses the first heat radiation part 160 for the second heat radiation part 260. As a result, the first and the second joint surfaces 165 and 265 can be joined certainly.

In the electronic substrate 100 in the first embodiment of the present invention, it is more desirable that the first and the second joint surface 165 and 265 are planes. As a result, the air gap between the first and the second joint surfaces 165 and 265 can be restrained to be formed and the first and the second joint surface 165 and 265 can be adhered each other. As a result, the generated heat of the heater element 120 can be transferred more efficiently to the second heat radiation part 260 from the first heat radiation part 160.

The electronic apparatus 1000 in the first embodiment of the present invention has an electronic substrate 100 mentioned above and a case 200 which accommodates an electronic substrate 100. Owing to this electronic apparatus 1000, it is take the same effect as an electronic substrate 100 mentioned above.

In an electronic apparatus 1000 in the first embodiment of the present invention, the case 200 is formed so as to hold a plurality of electronic substrates 100. The second joint surface 265 can be formed into the second heat radiation part 260 so as to connect with a plurality of first joint surfaces 165 thermally. In this case, the first heat radiation part 160 and the second heat radiation part 260 will not need to be set up by one to one, and it is, and an electronic apparatus can be composed more easily.

Figure 10:
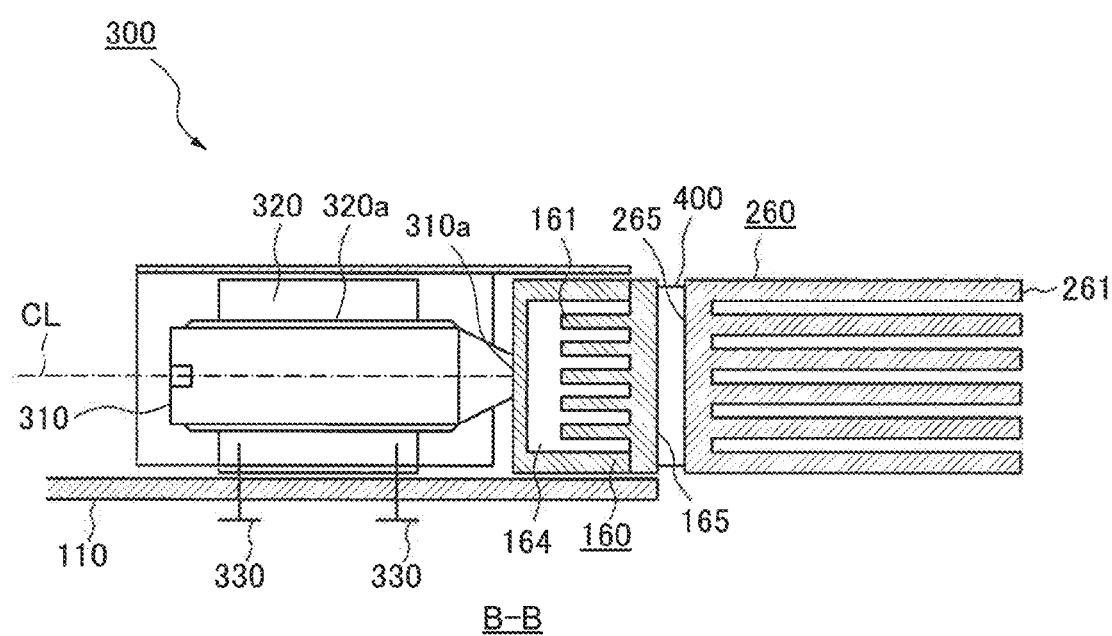
FIG. 10 is a cross section which shows the composition of the modification example of the electronic substrate in the first embodiment of the present invention.

Next, the configuration of the modification of the electronic substrate 100 in the first embodiment of the present invention will be described. FIG. 10 is a cross section which shows the composition of the modification of the electronic substrate 100 in the first embodiment of the present invention and is a figure corresponding to FIG. 5.

In contrast of FIG. 5 and FIG. 10, FIG. 10 is different from FIG. 5 in the point that the thermal conductivity member 400 intervenes between the first joint surface 165 and the second joint surface 265 in FIG. 10.

Here, the thermal conductivity member 400 is formed by the material that reduces the thermal resistance between the first and the second joint surfaces 165 and 265. Here, silicon type compounding or polymer resin, for example, is included in the material of the thermal conductivity member 400. Further, the heat conductive member 400 is often called TIM (Thermal Interface Material).

Thus, in the electronic substrate 100 in the first embodiment of the present invention, the thermal conductivity member 400 is installed between the first and the second joint surfaces 165 and 265. As a result, the thermal resistance between the first and the second joint surfaces 165 and 265 is reduced. By using the thermal conductivity member 400, the air gap between the first and the second joint surfaces 165 and 265 can be restrained to be formed and the first and the second joint surface 165 and 265 can be adhered each other. As a result, the generated heat of the heater element 120 can be transferred from the first heat radiation part 160 to the second heat radiation part 260 more efficiently.

The Second Embodiment

Next, an electronic substrate 100A in the second embodiment of the present invention will be described based on a figure. Further, an electronic substrate 100A is installed in the case 200 shown in FIG. 1 along the face which is almost parallel to the base material 100 so as to be insertable and removable. That is, an electronic apparatus includes the electronic substrate 100A instead of the electronic substrate 100 shown in FIG. 1.

Figure 11:
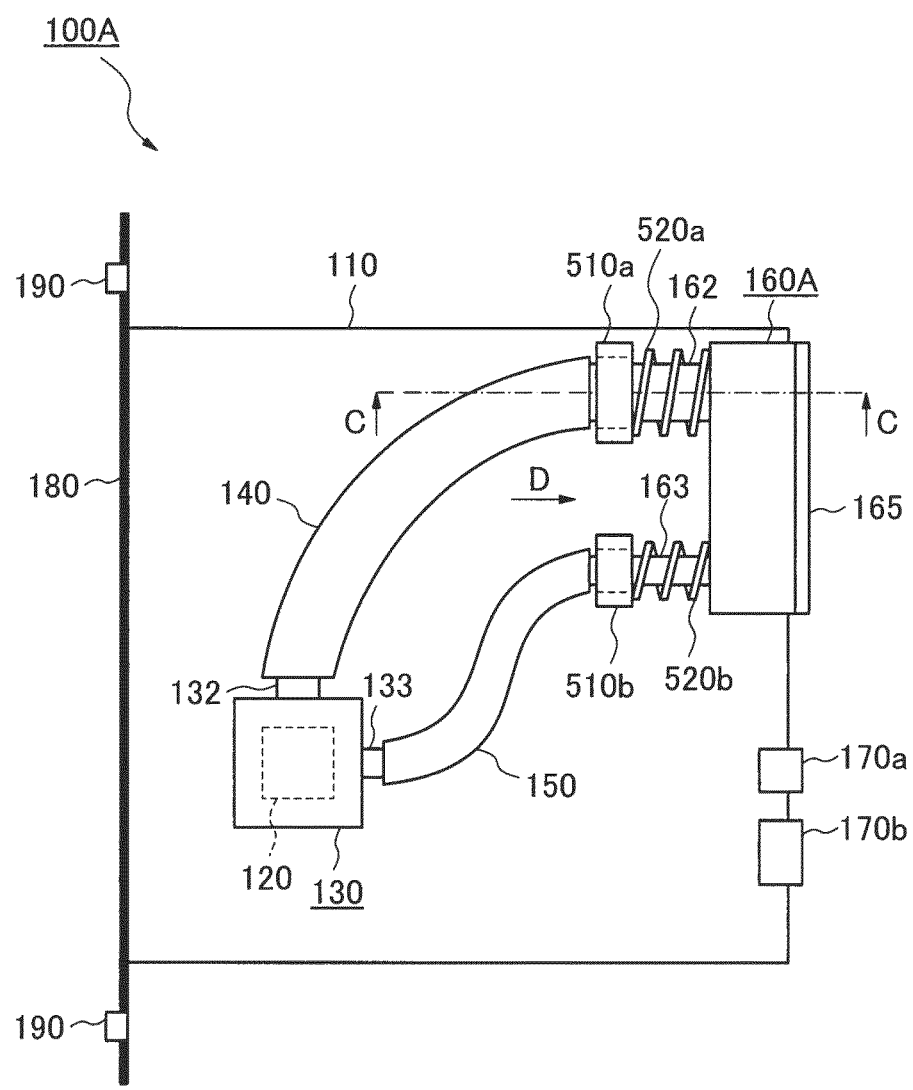
FIG. 11 is a plan view which shows the composition of the electronic substrate in the second embodiment of the present invention.
Figure 12:
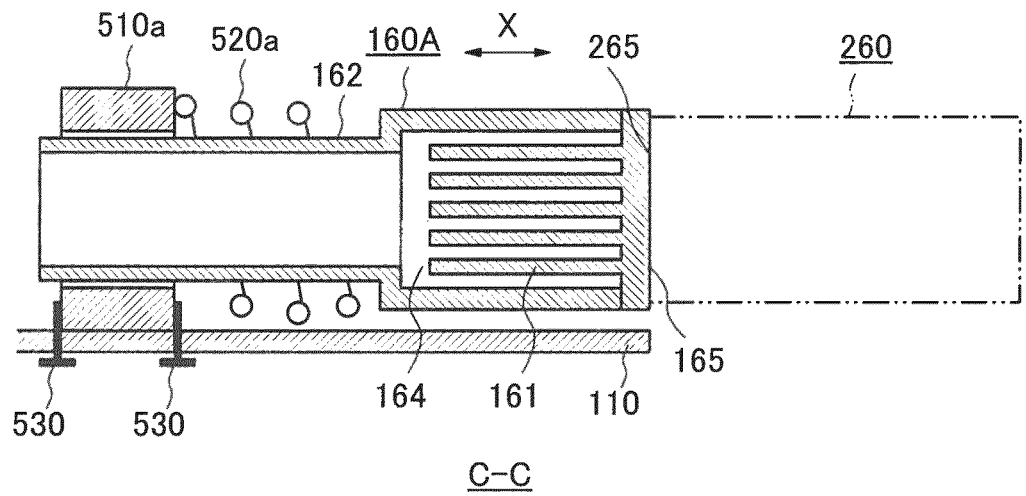
FIG. 12 is a cross section which shows a section when cutting by the C-C section of FIG. 11.
Figure 13:
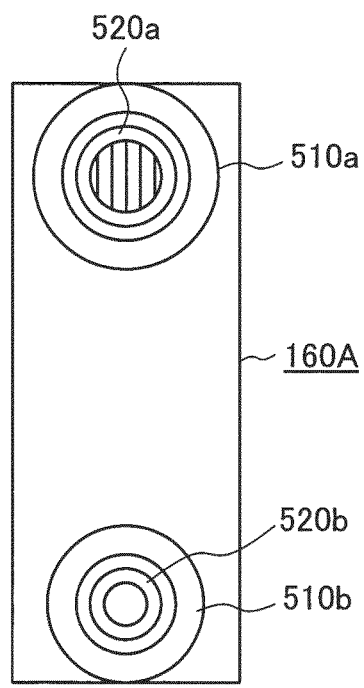
FIG. 13 is a figure which shows an arrow view D of FIG. 11.

FIG. 11 is a plan view which shows the composition of the electronic substrate 100A. FIG. 12 indicates a section when cutting by the C-C section of FIG. 11. FIG. 13 indicates an arrow view D of FIG. 11. Further, FIG. 12 indicates the section when cutting the electronic substrate 100A along the face which includes a center axis of a steam tube 162. In terms with the section when cutting the electronic substrate 100A along a face which includes a center axis of the liquid tube 163, the creation of the figure is omitted in spite that the component shown in the figure since the composition is similar to FIG. 12. In FIG. 12, for convenience of explanation, the second heat radiation part 260 is indicated by two dotted chain line. Further, in FIGS. 11-13, the same code as the code shown in FIGS. 1-10 is given for the component similar to each component shown in FIGS. 1-10 a code equal to a code shown in FIGS. 1-10.

As shown in FIG. 11, the electronic substrate 100A is composed to include a base material 110, a heater element 120, a boiling heat receiving part 130, a tube 140 for vapor, a tube 150 for liquid, the first heat radiation part 160A, the connectors 170a and 170b, the front board 180, a screw adhering portion 190, washer parts 510a and 510b and the spring parts 520a and 520b. Further, the heater element 120 can be installed and removed to the electronic substrate 100.

Here, FIG. 2 and FIG. 11 are contrasted. In FIG. 2, a pressing part 300 is installed in a portion which is almost central between the steam tube 162 and the liquid tube 163 in the first heat radiation part 160. In contrast, in FIG. 11, a washer part 510a and a spring part 520a are installed in the steam tube 162. Similarly, a washer part 510b and a spring part 520b are installed in the liquid tube 163.

The washer part 510a is installed in order to move along a steam tube 162. At that time, the steam tube 162 is installed in the direction which is almost vertical to the first and the second joint surfaces 165 and 265 so as to be lined along the surface of the base substrate 110. The washer part 510b is installed in order to move along the liquid tube 163. At that time, the liquid tube 163 is installed in the direction which is almost vertical to the first and the second joint surfaces 165 and 265 so as to be lined along the surface of the base substrate 110. These washer parts 510a and 510b are fixed by a screw 530 for washer part holding on the base material 110 as shown in FIG. 12. Further, the washer parts 510a and 510b correspond to a moving part of the present invention. The screw 530 for washer part holding corresponds to a moving part holding part of the present invention.

The spring part 520a is installed between the root part sides (right side of FIG. 12) of the washer part 510a and the steam tube 162. Similarly, the spring part 520b is installed between the root part sides (right side of FIG. 12) of the washer part 510b and the liquid tube 163. Further, an elastic material such as phosphor bronze, for example, is used for the material of the spring parts 520a and 520b. Further, the spring parts 520a and 520b correspond to an energizing part of the present invention.

Here, the washer part 510a, the spring part 520a and the steam tube 162 compose a pressing part of the present invention at least. Similarly, the washer part 510b, the spring part 520b and the liquid tube 163 compose a pressing part of the present invention at least. That is, when the electronic substrate 100A is installed in the case 200, each component of which these pressing parts are composed is pressed so that the first and the second joint surfaces 165 and 265 may connect thermally each other.

Specifically, as shown in FIG. 12, because the washer part 510a is fixed by the screw 530 for washer part holding on the base material 110, it is possible to move the second joint surface 165 to the direction of the arrow X. Similarly, because a washer part 510b is fixed by a screw 530 for washer part holding on the base material 110, it is possible to move the first joint surface 165 to the direction of the arrow X. At that time, the first heat radiation part 160 is held by each of the washer parts 510a and 510b. By adjusting the length of the lengthwise direction (horizontal direction of FIG. 12) of each of the washer parts 510a and 510b, the gap between the inner diameter of each of the washer parts 510a and 510b and the outer diameter of each of the pipes 162 and 163 to the appropriate length, the movement of the second heat radiation parts 160 is regulated to the direction of the arrow X.

When the electronic substrate 100A is installed in the case 200, the second joint surface 265 and the first joint surface 165 are arranged so as to oppose each other as shown in FIG. 12. And the spring part 520a energizes the first heat radiation part 160A for the second heat radiation part 260 between the washer part 510a and the first joint surface 165. Similarly, the spring part 520b energizes the first heat radiation part 160A for the second heat radiation part 260 between the washer part 510b and the first joint surface 265. As a result, the first joint surface 165 and the second joint surface 265 connect thermally each other more certainly. For this reason, the generated heat of the heater element 120 transferred to the first heat radiation part 160A is transferred to the second heat radiation part 260 more efficiently.

In the electronic substrate 100A in the second embodiment of the present invention, the pressing part is installed in the heat transfer part (boiling heat receiving part 130 and tube 140 for vapor) and a joint (steam tube 162) of the first heat radiation part 160 as mentioned above. As a result, the space of then installation site of the pressing part can be saved.

In the electronic substrate 100A in the second embodiment of the present invention, a joint which is a tube (steam tube 162 and liquid tube 163) is installed so as to extend in the direction which is almost vertical to the first joint surface 165 and the second joint surface 265. The pressing part is composed to include a moving part (washer parts 510a and 510b), a moving part holding part (a screw 530 for washer part holding) and an energizing part (spring parts 520a and 520b). Each of the washer parts 510a and 510b is provided along the steam tube 162 and the liquid tube 163 in order to move respectively. The screw 530 for washer part holding fixes each of washer parts 510a and 510b on the base material 110. The spring part 520a energizes the first heat radiation part 160A for the second heat radiation part 260 between the washer part 510a and the first joint surface 165. Similarly, the spring part 520b energizes the first heat radiation part 160A for the second heat radiation part 260 between the washer part 510b and the first joint surface 165. Thus, the spring parts 520a and 520b are set up as an energizing part, and the first heat radiation part 160A is energized for the second heat radiation parts 160 by these spring parts 520a and 520b. As a result, a stable urging force is added to the first heat radiation part 160A, and the first and the second joint surfaces 165 and 265 can be stuck each other more certainly and connected thermally. As a result, because the generated heat of the heater element 120 which has been transferred to the first heat radiation part 160A can be transferred to the second heat radiation part 260, the generated heat of a heater element 120 can be radiated more efficiently.

In the electronic substrate 100A in the second embodiment of the present invention, the tube is a refrigerant inflow outflow tube (steam tube 162 and liquid tube 163) for making a refrigerant flow in or pour to the condensing part 164. As a result, the steam tube 162 and the liquid tube 163 can perform the function as the refrigerant inflow outflow tube which makes the refrigerant flow in or pour in addition to the function as the heat transfer part and the joint of the first heat radiation part 160 and the function as the installation site of a pressing part.

In then electronic substrate 100A in the second embodiment of the present invention, the energizing part (spring parts 520a and 520b) includes an elastic member (phosphor bronze, for example). As a result, the urging force of the spring parts 520a and 520b as an energizing part can be made stable.

The Third Embodiment

Next, an electronic substrate 100B in the third embodiment of the present invention will be described based on a figure. Further, the electronic substrate 100B is installed in the case 200 shown in FIG. 1 along a face almost parallel to the surface of the base material 100 so as to be plugged in/out. That is, the electronic apparatus is composed by installing the electronic substrate 100B instead of the electronic substrate 100 shown in FIG. 1.

Figure 14:
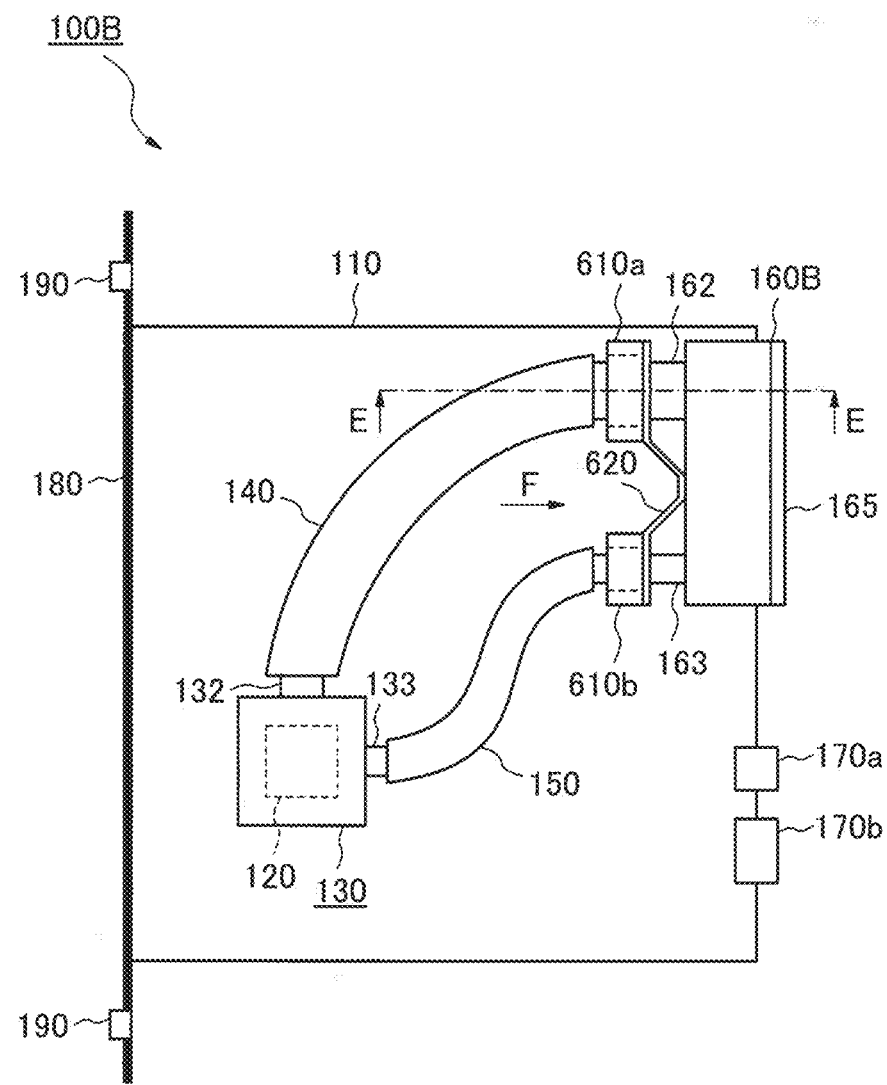
FIG. 14 a plan view which shows the composition of the electronic substrate in the third embodiment of the present invention.
Figure 15:
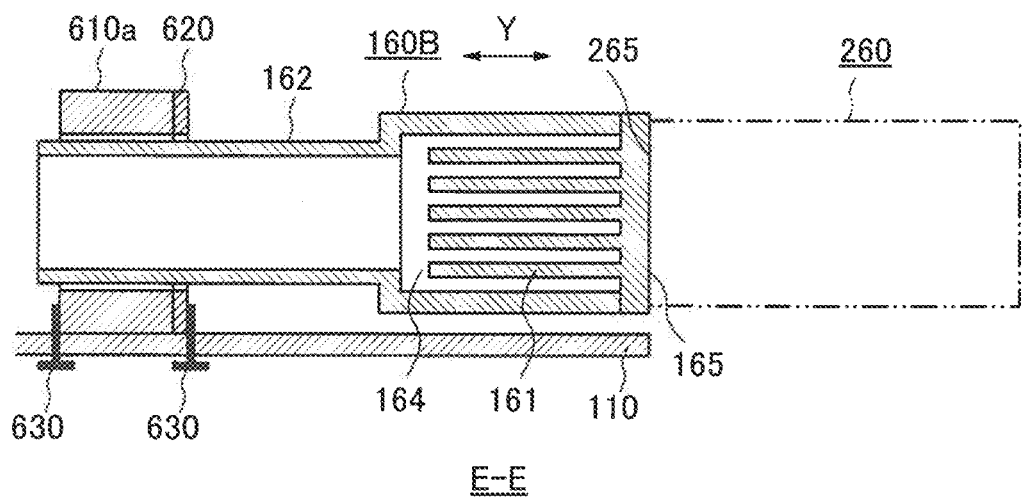
FIG. 15 is a cross section which shows a section when cutting by the E-E section of FIG. 14.
Figure 16:
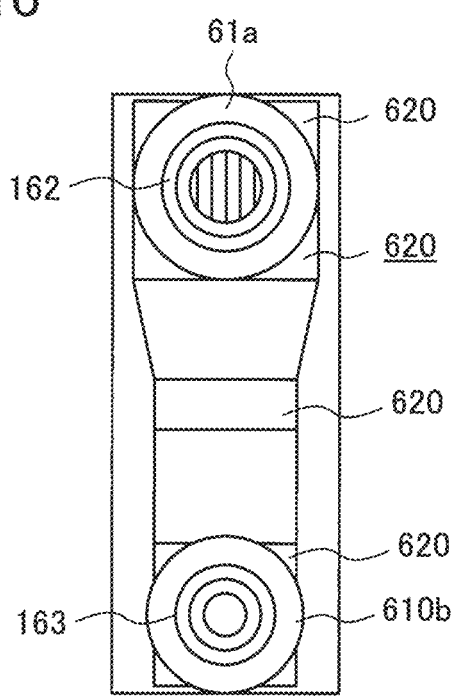
FIG. 16 is a figure which shows an arrow view F of FIG. 14.

FIG. 14 is a plan view which shows the composition of the electronic substrate 100B. FIG. 15 indicates a section when cutting by the E-E section of FIG. 14. FIG. 16 indicates a narrow view F of FIG. 14. Further, FIG. 15 indicates the section when cutting the electronic substrate 100B, along the face including a center axis of the steam tube 162. In terms with the section when cutting an electronic substrate 100B, along a center axis of a liquid tube 163, the creation of a figure is omitted since the component shown in the figure is the configuration equal to FIG. 15 although it is different. In FIG. 15, for convenience of the explanation, the second heat radiation part 260 is indicated by a two-dotted chain line. Further, in FIGS. 14-16, the code equal to the code shown in FIG. 1 to FIG. 13 is assigned to the component equal to each component shown in FIG. 1 to FIG. 13, in FIG. 14 to FIG. 16.

As shown in FIG. 14, the electronic substrate 100B is composed to include a base material 110, a heater element 120, a boiling heat receiving part 130, a tube 140 for vapor, a tube 150 for liquid, the first heat radiation part 160B, connectors 170a and 170b, a front board 180, a screw adhering portion 190, washer parts 610a and 610b and the spring part 620. Further, the heater element 120 can be plugged in and removed to the electronic substrate 100. The washer parts 610a and 610b correspond to a moving part of the present invention. The spring part 620 corresponds to an energizing part of the present invention. Further, the washer parts 610a and 610b have the same function as the washer parts 510a and 510b shown in FIG. 11.

Here, FIG. 2 and FIG. 14 are contrasted. In FIG. 2, a pressing part 300 is installed in an almost central portion between the steam tube 162 and the liquid tube 163 among the first heat radiation part 160. In contrast, in FIG. 14, the washer part 610a and the spring part 620 are installed in the steam tube 162. Similarly, the washer part 610b and the spring part 620 are installed in the liquid tube 163.

FIG. 11 and FIG. 14 are contrasted. In FIG. 11, the washer part 510a and the vine-twine shape spring part 520a are installed in the steam tube 162. Similarly, the washer part 510b and the vine-twine shape spring part 520b are installed in the liquid tube 163. In contrast, in FIG. 14, the washer part 610a and the tabular spring part 620 are installed in the steam tube 162. Similarly, the washer part 610b and the tabular spring part 620 are installed in the liquid tube 163.

The washer part 610a is installed in order to move along the steam tube 162. At that time, the steam tube 162 is installed so as to be lined to the direction almost vertical to the first and the second joint surface 265 and 165 along the face of the base substrate 100. The washer part 610b is installed in order to move along the liquid tube 163. At that time, the liquid tube 163 is installed so as to be lined to the direction almost vertical to the first and the second joint surface 265 and 165 along the face of the base substrate 100. The washer parts 610a and 610b are fixed by the screw 630 for washer part holding on the base material 110 as shown in FIG. 15. Further, the screw 630 for the washer part holding corresponds to the moving part holding part of the present invention.

As shown in FIG. 14 to FIG. 16, the spring part 620 is installed between the washer part 610a and the root part sides (right side of FIG. 15) of the steam tube 162. Similarly, the spring part 620 is installed between the washer part 610b and the root part sides (right side of FIG. 15) of the liquid tube 163. As shown in FIG. 14 to FIG. 16, both ends of the spring part 620 are installed in the steam tube 162 and the liquid tube 163. The central portion of the spring part 620 is arranged in an almost central portion of the opposite surface to the first joint surface 165 among the first heat radiation part 160B. Further, the material of the spring part 620 includes an elastic material of phosphor bronze, for example.

Here, the washer parts 610a and 610b, the spring part 620 and the steam tube 162 compose a pressing part of the present invention at least. When the electronic substrate 100B is installed in the case 200, the first and the second joint surface 165 and 265 adhere each other, and each component of which these pressing parts are composed is pressed so as to be connected thermally.

Specifically, as shown in FIG. 15, because the washer parts 610a and 610b are fixed by the screw 630 for the washer part holding on the base material 110, the spring part 620 can move the first joint surface 165 of the first heat radiation part 160B to the direction of the arrow Y. At that time, the first heat radiation part 160B is held in by each of the washer parts 610a and 610b. By adjusting the length of the lengthwise direction (horizontal direction of FIG. 15) of each of the washer parts 610a and 610b, the gap between the inner diameter of each of the washer parts 610a and 610b and the outer diameter of each of the pipes 162 and 163 to the appropriate length, the movement of the second heat radiation parts 160 is regulated to the direction of the arrow X.

As shown in FIG. 15, when the electronic substrate 100B is installed in the case 200, it is arranged so that the first joint surface 165 may oppose to the second joint surface 265. And the spring part 620 energizes the first heat radiation part 160B for the second heat radiation part 260 between the washer parts 610a and 610b and the first joint surface 165. At that time, a central portion of the spring part 620 is arranged in an almost central portion of the opposite face to the first joint surface 165 among the first heat radiation part 160B. Accordingly, by the urging force of the spring part 620, a central portion of the spring part 620 presses the first heat radiation part 160B for the second heat radiation part 260. In particular, because a central portion of the spring part 620 is arranged in the almost central portion of the surface of the opposite side to the first joint surface 165 among the first heat radiation part 160B, the urging force of the spring part 620 presses the almost central portion of the first joint surface 165. As a result, the first joint surface 165 and the second joint surface 265 adhere more certainly and connect thermally. Accordingly, the generated heat of the heater element 120 transferred in the first heat radiation part 160B is transferred to the second heat radiation part 260. As a result, the generated heat of the heater element 120 can be radiated more efficiently.

In this way, even if the tabular spring part 620 is installed instead of the vine-twine shape spring parts 520a and 520b, the first heat radiation part 160B can be energized for the second heat radiation part 260 by this spring part 620 as an energizing part in the electronic substrate 100B in the third embodiment of the present invention. As a result, a stable urging force is added to the first heat radiation part 160B, and the first and the second joint surfaces 165 and 265 can be adhered more certainly and connected thermally. As a result, because the generated heat of the heater element 120 transferred in the first heat radiation part 160B can be transferred to the second heat radiation part 260 similar to the effect mentioned before, the generated heat of the heater element 120 can be radiated more efficiently.

The Fourth Embodiment

Next, an electronic substrate 100C in the fourth embodiment of the present invention will be described based on a figure. Further, the electronic substrate 100C is installed in the case 200 shown in FIG. 1 along a face almost parallel to the surface of the base material 110 so as to be plugged in and out. That is, an electronic apparatus is composed by installing the electronic substrate 110C instead of the electronic substrate 100 shown in FIG. 1.

Figure 17:
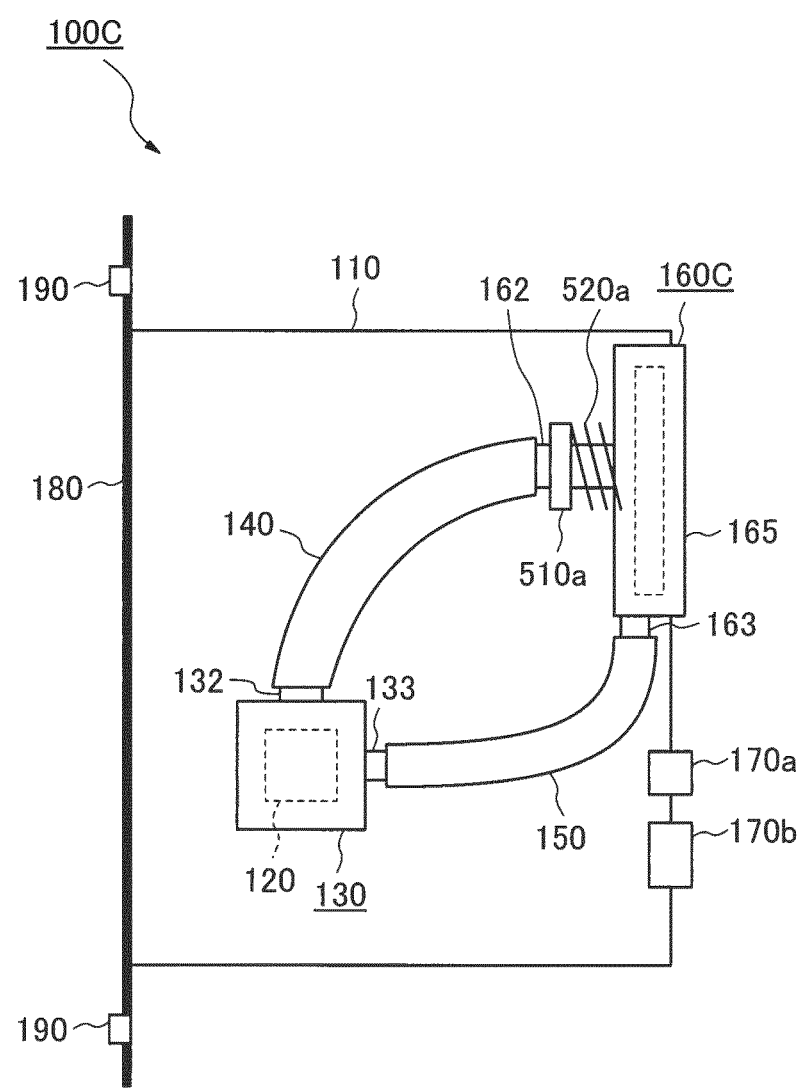
FIG. 17 is a plan view which shows the composition of the electronic substrate in the fourth embodiment of the present invention.

FIG. 17 is a plan view which shows the composition of the electronic substrate 100C. The section when cutting in a face including a centerline of the steam tube 162 of FIG. 17 is same as the section which has been cut by the C-C section shown in FIG. 12. Further, in FIG. 17, a code equal to a code shown in FIG. 1 to FIG. 16 is attached to each component equal to the component shown in FIG. 1 to FIG. 16.

As shown in FIG. 17, the electronic substrate 100C is composed to include a base material 110, a heater element 120, a boiling heat receiving part 130, a tube 140 for vapor, a tube 150 for liquid, the first heat radiation part 160C, connectors 170a and 170b, a front board 180, a screw adhering portion 190, a washer part 510a and a spring part 520a. Further, the heater element 120 can be installed and removed to the electronic substrate 100C. The washer part 510a corresponds to the moving part of the present invention similar to the description of FIG. 11 and FIG. 12. The spring part 520a also corresponds to the energizing part of the present invention.

Here, FIG. 2 and FIG. 17 are contrasted. In FIG. 2, a pressing part 300 is installed in an almost central portion between the steam tube 162 and the liquid tube 163 among the first heat radiation part 160. In contrast, in FIG. 17, the washer part 520a and the spring part 520a are installed in the steam tube 162. The liquid tube 163 is installed in the face which is different from the face in which the steam tube 162 is installed among the second heat radiation part 260. That is, the location of the liquid tube of FIG. 2 is different from the location of FIG. 17.

FIG. 11 and FIG. 17 are contrasted. In FIG. 11, the washer part 510a and the spring part 520a are installed in the steam tube 162. Similarly, the washer part 510b and the spring part 520b are installed in the liquid tube 163. In contrast, in FIG. 17, the washer part 510a and the spring part 520a are installed in only the steam tube 162 while they are not installed in the liquid tube 163.

In the electronic substrate 100C in the fourth embodiment of the present invention, only one spring part 520a is installed as an energizing part se mentioned above. Thus, the first heat radiation part 160C can be energized as an energizing part for the second heat radiation part 260 by this spring part 520a owing to only the set-up of one spring part 520a. Further, it is more desirable to arrange the steam tube 162 in the position corresponding to the central portion in the first joint surface 165 concerning to arrangement of the steam tube 162. As a result, the spring part 520a presses the first heat radiation part 160C to the second heat radiation part 260, in the first joint surface 165, is pressed for centering on a central portion almost. As a result, the first and the second joint surfaces 165 and 265 can be adhered more certainly and connected thermally.

The Fifth Embodiment

Figure 18:
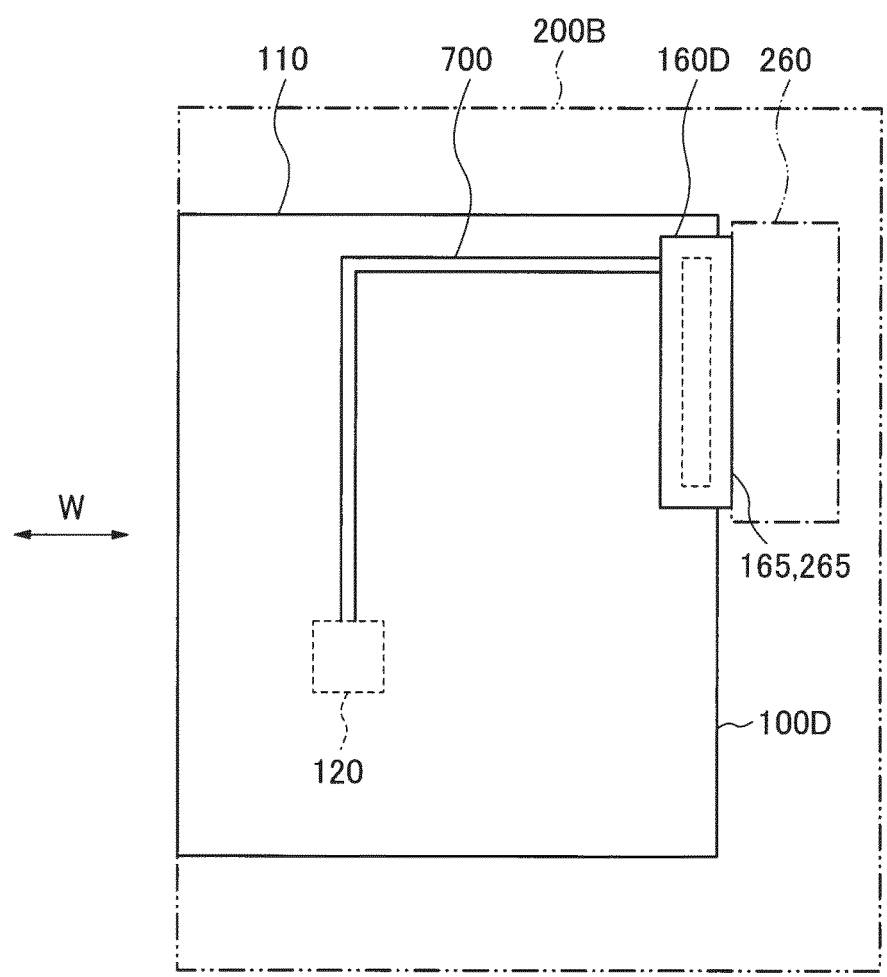
FIG. 18 is a plan view which shows the composition of the electronic substrate in the fifth embodiment of the present invention.

Next, an electronic substrate 100D in the fifth embodiment of the present invention will be described based on a figure. FIG. 18 is a plan view which shows the composition of the electronic substrate 100D. In FIG. 18, for convenience of the explanation, a case 200B which accommodates the electronic substrate 100D is indicated by a two-dotted chain line. Further, in FIG. 18, a code equal to a code shown in FIG. 1 to FIG. 17 is attached to each component equal to the component shown in FIG. 1 to FIG. 17.

As shown in FIG. 18, the electronic substrate 100D has the tabular base material 110 and the cooling structure (the detail will be described later). A heater element 120 can be loaded into the tabular base material 110. The cooling structure cools the heater element 120. Further, in FIG. 18, the heater element 120 is indicated by a dotted line.

The base material 110 is insertable and removable in the almost parallel to the surface of the base material 110 in the case 200B. The insertion and removal direction W of the electronic substrate 100D is shown in FIG. 18. That is, by inserting the base material 100 inside the case 200B in the direction which is almost parallel to the surface of the base material 110, the electronic substrate 100D can be installed in the case 200B. Conversely, by removing the base material 100 from the case 200B in the direction which is almost parallel to the surface of the base material 110, the electronic substrate 100D can be removed from the case 200B.

The cooling structure is installed in the base material 100. The cooling structure is composed to include the first heat radiation part 160D and the heat transfer part 700.

The first heat radiation part 160D is formed in a hollow shape and installed in the tabular base material 110. The first heat radiation part 160D radiates the generated heat of the heater element 120 which is loaded in the base material 110. The first heat radiation part 160D is equipped with the first joint surface 165 that is an almost vertical face to the surface of the base material 100. This first joint surface 165 is installed so as to oppose to the second joint surface 265 of which the second heat radiation part 260 is composed, as shown in FIG. 18. The first joint surface 165 is almost vertical to the insert and removal direction W (refer to FIG. 18) of the electronic substrate 100D. The first heat radiation part 160D connects to the second heat radiation part 260 thermally through the first joint surface 165 as shown in FIG. 18.

The heat transfer part 700 transfers the generated heat of the heater element 120 loaded into the base material 110 to the first heat radiation part 160D.

As mentioned above, the electronic substrate 100D in the fifth embodiment of the present invention has the tabular base material 110 and the cooling structure. The base material 110 can load the heater element 120. The electronic substrate 100D is installed so as to be insertable and removable to the direction which is almost parallel to the surface of the base material 110 in the case 200. The cooling structure cools the heater element 120. The cooling structure is installed on the tabular base material 110, and has the first heat radiation part 160D with a hollow shape and the heat transfer part 700 at least. The first heat radiation part 160 with a hollow shape radiates the generated heat of the heater element 120 which is loaded on the base material 110. The heat transfer part 700 transfers the generated heat of the heater element 120 to the first heat radiation part 160D. The first heat radiation part 160D has the first joint surface 165 formed along the face which is almost vertical to the insert and removal direction W of the base material 110. And the first heat radiation part 160D is connected to the second heat radiation part 260 installed in the case 200 thermally through the first joint surface 165.

Thus, in the electronic substrate 100D in the fifth embodiment of the present invention, the generated heat of the heater element 120 is transferred by the heat transfer part 700 to the first heat radiation part 160D. And the first heat radiation part 160D is connected to the second heat radiation part 260 of the case 200B thermally through the first joint surface 165. The first joint surface 165 of the first heat radiation part 160D is almost vertical to the insert and removal direction of the base material 110. The base material 110 can plug in and out for the case 100 in a face which is almost parallel to the base material 110. As a result, when inserted in the case 200 along a face (insert and removal direction W of the electronic substrate 100D) which is almost parallel to the surface of the base material 110, the first heat radiation part 160D joins to the second heat radiation part 260 thermally through the first joint surface 165. As a result, by transferring the generated heat of the heater element 12 to the second heat radiation part 260 from the first heat radiation part 160D, the generated heat of the heater element 120 is radiated.

At that time, the first heat radiation part 160D and the second heat radiation part 260 are connected thermally each other through the first joint surface 165 that is a face which is almost vertical to the insert and removal direction of the electronic substrate 100. That is, in the present invention, the first heat radiation part 160D and the second heat radiation part 260 are not joined in the face which is almost parallel to the insert and removal direction of the electronic substrate 100, unlike the technology described in patent document 1. For this reason, it can be suppressed that the friction generates between the face which the first heat radiation part 160D and the second heat radiation part 260 join each other at the time of an insert and removal of the electronic substrate 100D. Accordingly, because it becomes difficult for a bruise to be formed on the surface of the joint face of the first heat radiation part 160D or the second heat radiation part 260, and the thermal resistance does not increase caused by the corrosion in the joint surface, the generated heat of the heater element 120 can be transferred to the second heat radiation part 260 with high efficiency.

Directly, the first heat radiation part 160D with a hollow shape connects with the second heat radiation part 260 of the case 200 thermally through the first joint surface 165 of the first heat radiation part 160D. That is, in the present invention, it does not need to install another member like the heat transfer part described in patent document 2, and connect the first heat radiation part 160D with a hollow shape and the second heat radiation part 260 thermally. For this reason, the thermal resistance between the first heat radiation part 160D with a hollow shape and the second heat radiation part 260 can be suppressed low, and then the generated heat of the heater element 120 can be transferred to the second heat radiation part 260 with high efficiency.

According to the electronic substrate 100D of the fifth embodiment of the present invention as mentioned above, because the first heat radiation part 160D and the second heat radiation part 260 are connected thermally in direct through the first joint surface 165 that is a face which is almost vertical to the insert and removal direction of the electronic substrate 100, the generated heat of a heater element 120 can be radiated more efficiently.

Further, in the description of the fourth above-mentioned embodiment, it has been explained that the case 200 has three areas of an exhaust area 200a, a substrate mount area 200b and an intake area 200c. However, for example, in the case that the size of the electronic apparatus is small or the case that the calorific value of the heater element is small, the case 200 may be composed only by the substrate mount area 200b.

In this way, the present invention has been described based on the embodiment. Unless deviating from a main point of the present invention, the various change, fluctuation and combination may be added to each embodiment mentioned above. It can be also understood by a person skilled in the art that the modification of these change, fluctuation and combination belong to the alterations in the scope of the present invention.

This application insists on priority based on Japanese Patent Application No. 2011-183607 proposed on Aug. 25, 2011 and takes everything of the disclosure here.

INDUSTRIAL APPLICABILITY

An electronic substrate and an electronic apparatus of the present invention can be applied to a communication apparatus and an electronic apparatus of a PC, for example.

DESCRIPTION OF A CODE 100, 100A, 100B, 100C, 100D Electronic substrate.
110 Base material.
120 Heater element.
130 Boiling heat receiving part.
131 Boiling heat receiving part side fin part.
132 Steam tube.
133 Liquid tube.
134 Refrigerant boiling part.
140 Tube for vapor.
150 Tube for liquid.
160, 160A, 160B, 160C, 160D First heat radiation part.
161 First heat radiation part side fin part.
162 Steam tube.
163 Liquid tube.
164 Condensing part.
165 First joint surface.
200, 200B Case.
200a Exhaust area.
200b Substrate mount area.
200c Intake area.

210 Fan part.
220 Intake vent.
230 Exhaust port.
240 First vent.
250 Second vent.
260 Second heat radiation part.
261 Case side fin part.
265 Second joint surface.
300 Pressing part.
310 Press screw part.
320 Screw guide.
330 Screw guide fixed screw.
400 Thermal conductivity member.
510a, 510b Washer part
520a, 520b Spring part
530 Screw for washer part holding.
610a, 610b washer part
620 Spring part.
630 Screw for washer part holding.
700 Heat transfer part.

The invention claimed is:

1. An electronic substrate including a tabular base material which installs a heater element and a cooling structure which cools the generated heat of the heater element,
in which the base material is possible to be plugged in and out in a case to the direction which is almost parallel to the surface of the base material,
the cooling structure provided for the base material is equipped with
a first heat radiation part with a hollow shape that radiates the generated heat of the heater element installed in the base material, and
a heat transfer part that transfers the generated heat of the heater element to the first heat radiation part, and
the first heat radiation part is equipped with
a first joint surface that is a face which is almost vertical to the insert and removal direction of the base material,
and connects with a second heat radiation part installed thermally in the case through the first joint surface, and
a pressing part that presses the first heat radiation part towards the second heat radiation part so that a second joint surface that is a face of which the second heat radiation part is composed and opposes to the first joint surface may connect to the first joint surface thermally, and is installed at a joint part of the heat transfer part and the first heat radiation part,
wherein
the joint part is a tube installed so as to be extended in the direction which is almost vertical to the first and the second joint surfaces, and
the pressing part includes
a moving part which is installed so as to move along the tube,
a moving part holding part which fixes the moving part in the base material,
and an energizing part which energizes the first heat radiation part for the second heat radiation part between the moving part and the first joint surface.

2. The electronic substrate according to claim 1, in which the heat transfer part transfers the generated heat of the heater element to the first heat radiation part through a refrigerant, and
the first heat radiation part includes a condensing part with a hollow shape, in which the refrigerant vaporized by the heat generation of the heater element is poured, for cooling and condensing the refrigerant which is vaporized.

3. The electronic substrate according to claim 1 in which the first joint surface presses the position corresponding to an almost central portion.

4. The electronic substrate according to claim 1, in which the pressing part includes a screw part which is installed on the surface of the base material and whose central axis has been arranged in the direction which is almost vertical to said the first and the second joint surfaces, and
a tip portion of the screw part presses the first heat radiation part to the second heat radiation part.

5. The electronic substrate according to claim 1 in which the tube is a refrigerant inflow/outflow tube for flowing in and flowing out the refrigerant to the condensing part.

6. The electronic substrate according to claim 1, in which the energizing part includes an elastic member.

7. The electronic substrate according to claim 1, in which a thermal conductivity member has been installed between the first and the second joint surfaces.

8. The electronic substrate according to claim 1 in which the first and the second joint surface are planes.

9. An electronic apparatus including an electronic substrate and a case which accommodates the electronic substrate,
in which the electronic substrate has installs can install a heater element and a cooling structure that cools the generated heat of the heater element, and the base material is possible to be plugged in/out on a case in the direction which is almost parallel to the surface of the base material,
the cooling structure installed in the base material is equipped with
a first heat radiation part with a hollow shape that radiates the generated heat of the heater element installed on the base material, and
a heat transfer part that transfers the generated heat of the heater element to the first heat radiation part,
in which the first heat radiation part is equipped with a first joint surface that is a face which is almost vertical to the insert and removal direction of the base material and connects a second heat radiation part set up to the case thermally through the first joint surface, and
a pressing part that presses the first heat radiation part towards the second heat radiation part so that the second joint surface that is a face of which the second heat radiation part is composed and opposes to the first joint surface may connect to the first joint surface thermally, and is installed at a joint part of the heat transfer part and the first heat radiation part,
wherein
the joint part is a tube installed so as to be extended in the direction which is almost vertical to the first and the second joint surfaces, and
the pressing part includes
a moving part which is installed so as to move along the tube,
a moving part holding part which fixes the moving part in the base material, and
an energizing part which energizes the first heat radiation part for the second heat radiation part between the moving part and the first joint surface.

10. The electronic apparatus according to claim 9 in which the case is formed so as to hold a plurality of the electronic substrates, and
the second joint surface is formed on the second heat radiation part in order to connect with a plurality of the first joint surfaces thermally.

11. An electronic substrate comprising:
a base material that installs a heater element;
a cooling structure that cools heat generated from the heater element,
wherein the base material is plugged into and out of a case in an insert and removal direction that is substantially parallel to a surface of the base material,
wherein the cooling structure comprises a first heat radiator and a heat conveyor,
wherein the heat conveyor transfers the heat to the first heat radiator,
wherein the first heat radiator comprises
   a hollow shape that radiates the heat from the heater element,
   a first joint surface that is substantially vertical to the insert and removal direction and couples with a second heat radiator installed thermally in the case through the first joint surface,
wherein the second heat radiator comprises a second joint surface; and
wherein the first heat radiator is pressed towards the second heat radiator such that the second joint surface opposes the first joint surface, connects to the first joint surface thermally, and is installed at a location corresponding to a tube where the heat conveyor and the first heat radiator join,
wherein the tube extends in a direction that is substantially vertical to the first and the second joint surfaces,
wherein the first heat radiator is pressed towards the second heat radiator by a part that moves along the tube,
wherein the part is fixed in the base material, and
wherein the first heat radiator is energized for the second heat radiator between the part and the first joint surface.

* * * * *